US009112162B2

(12) United States Patent
Miyamoto et al.

(10) Patent No.: US 9,112,162 B2
(45) Date of Patent: Aug. 18, 2015

(54) ELECTRONIC DEVICE AND ELECTRONIC DEVICE MANUFACTURING METHOD

(71) Applicant: PANASONIC CORPORATION, Osaka (JP)

(72) Inventors: Akihito Miyamoto, Osaka (JP); Yuko Okumoto, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/551,564

(22) Filed: Nov. 24, 2014

(65) Prior Publication Data

US 2015/0076482 A1    Mar. 19, 2015

Related U.S. Application Data

(63) Continuation of application No. PCT/JP2014/001722, filed on Mar. 25, 2014.

(30) Foreign Application Priority Data

Mar. 26, 2013    (JP) ................................ 2013-063848

(51) Int. Cl.
*H01L 51/40*    (2006.01)
*H01L 51/05*    (2006.01)
(Continued)

(52) U.S. Cl.
CPC .......... *H01L 51/0545* (2013.01); *H01L 29/786* (2013.01); *H01L 27/3246* (2013.01); *H01L 51/0036* (2013.01); *H01L 51/5088* (2013.01)

(58) Field of Classification Search
CPC ............ H01L 51/0545; H01L 51/5088; H01L 51/0036; H01L 27/3246

USPC ................................................ 438/99; 257/22
See application file for complete search history.

(56) References Cited

U.S. PATENT DOCUMENTS 8,130,177 B2    3/2012    Nakatani et al.
8,907,344 B2    12/2014    Okumoto et al.
(Continued)

FOREIGN PATENT DOCUMENTS

JP    2004-314056    11/2004
JP    2007-273874    10/2007
(Continued)

OTHER PUBLICATIONS

U.S. Appl. No. 14/059,559 to Yuko Okumoto et al., filed Oct. 22, 2013.
(Continued)

*Primary Examiner* — Nicholas Tobergte
(74) *Attorney, Agent, or Firm* — Greenblum & Bernstein, P.L.C.

(57) ABSTRACT

An electronic device including: a substrate; a bank formed on an upper surface of the substrate, surrounding an area of the upper surface of the substrate, and defining an aperture from which the area is exposed; a liquid-philic layer formed on a peripheral portion of the area, and not overlapping a central portion of the area; a semiconductor layer formed within the aperture, and attaching to at least a portion of the central portion and to an upper surface of the liquid-philic layer; and a pair of electrodes that are in contact with an area of the semiconductor layer, the area of the semiconductor layer not overlapping the liquid-philic layer in plan view. The bank has a liquid-phobic lateral surface surrounding the aperture, and the upper surface of the liquid-philic layer has a higher degree of liquid-philicity than the upper surface of the substrate.

11 Claims, 15 Drawing Sheets

(51) Int. Cl.
*H01L 29/786* (2006.01)
*H01L 51/50* (2006.01)
*H01L 51/00* (2006.01)
*H01L 27/32* (2006.01)

(56) References Cited

U.S. PATENT DOCUMENTS

| | | | |
|---|---|---|---|
| 8,941,115 B2 | 1/2015 | Okumoto et al. | |
| 8,946,730 B2 | 2/2015 | Okumoto et al. | |
| 8,969,884 B2 | 3/2015 | Okumoto et al. | |
| 2005/0191781 A1 | 9/2005 | Hirai | |
| 2009/0215350 A1* | 8/2009 | Takei et al. | 445/23 |
| 2009/0256144 A1 | 10/2009 | Kano et al. | |
| 2013/0328033 A1 | 12/2013 | Okumoto et al. | |
| 2014/0034933 A1 | 2/2014 | Okumoto et al. | |

FOREIGN PATENT DOCUMENTS

| | | |
|---|---|---|
| JP | 2008-205284 | 9/2008 |
| JP | 2009-076791 | 4/2009 |
| JP | 2009-212127 | 9/2009 |
| WO | 2013/073090 | 5/2013 |

OTHER PUBLICATIONS

U.S. Appl. No. 14/551,540 to Akihito Miyamoto et al., filed Nov. 24, 2014.

U.S. Appl. No. 14/061,057 to Yuko Okumoto et al., filed Oct. 23, 2013.

International Search Report (ISR) in International Patent Application No. PCT/JP2014/001722, dated Jun. 24, 2014.

* cited by examiner

ELECTRONIC DEVICE AND ELECTRONIC DEVICE MANUFACTURING METHOD

CROSS REFERENCE TO RELATED APPLICATION

This is a continuation application of PCT Application No. PCT/JP2014/001722 filed on Mar. 25, 2014, designating the United States of America, the disclosure of which, including the specification, drawings and claims, is incorporated herein by reference in its entirety.

TECHNICAL FIELD

The present disclosure relates to an electronic device and an electronic device manufacturing method.

BACKGROUND ART

In active matrix drive display devices having, for example, liquid crystal display elements or organic electroluminescence (EL) elements as display elements, thin-film transistors (TFTs) are commonly used as driving elements for the display elements.

In display device products, TFTs in which a silicon layer is used as a semiconductor layer are commonly used. Now, however, more attention is being given to TFTs in which an organic material layer is used as a semiconductor layer. Unlike atomic bonding in silicon crystals for example, the binding forces acting in organic materials are intermolecular forces, and hence organic materials are flexible. Therefore, by using TFTs in which an organic material layer is used as a semiconductor layer, it is possible to realize lighter and thinner electronic devices compared to electronic devices using TFTs in which a silicon layer is used as a semiconductor layer, and it is also possible to provide flexibility to the electronic devices. For this reason, there is a proposal to use such TFTs, in which an organic material layer is used as a semiconductor layer, in next-generation display devices and electronic paper, for example. Regarding TFTs in which an organic material layer is used as a semiconductor layer, Patent Literature 1 discloses a coating-type TFT in which a semiconductor layer is formed by a coating method.

FIG. 28 is a schematic top view illustrating an example configuration of a common coating-type TFT 900.

As shown in FIG. 28, the TFT 900 includes a pair of a source electrode 904S and a drain electrode 904D, a bank 905, and a semiconductor layer 907. The bank 905 defines an aperture 906 where the semiconductor layer 907 is to be formed. The lateral surface of the bank 905 surrounding the aperture 906 is formed to be liquid-phobic. The semiconductor layer 907 is formed within aperture 906. The semiconductor layer 907 is formed in the following manner. First, semiconductor ink is prepared by dispersing organic material for forming the semiconductor layer 907 in a solvent. Next, the semiconductor ink is applied within the aperture 906. Finally, the solvent contained in the semiconductor ink is dried to evaporate. Thus, the semiconductor layer 907 is formed within the aperture 906.

CITATION LIST

Patent Literature

[Patent Literature 1] Japanese Patent Application Publication No. 2009-76791

SUMMARY

Technical Problem

The properties of electronic devices having a semiconductor layer, such as TFTs, are likely to change according to the cross-sectional shape of the semiconductor layer. Therefore, when forming the semiconductor layer by a coating method, the cross-sectional shape of the semiconductor layer needs to be determined appropriately in order to achieve desirable properties of the electronic device.

However, the inventors found that, in the common configuration illustrated in FIG. 28, the semiconductor layer is likely to have a small film thickness at an area near the center within the aperture, and to have a large film thickness near the inner edge of the aperture, because the lateral surface of the bank surrounding the aperture has a liquid-phobicity, and that this phenomenon would lead to degradation of the properties of the transistor.

The present disclosure aims to provide, for example, an electronic device with a semiconductor layer having an appropriate cross-sectional shape.

Solution to Problem

An electronic device pertaining to one aspect of the present disclosure includes: a substrate; a bank formed on an upper surface of the substrate, surrounding an area of the upper surface of the substrate, and defining an aperture from which the area of the upper surface is exposed; a liquid-philic layer formed on a peripheral portion of the area of the upper surface of the substrate, and not overlapping a central portion of the area of the upper surface of the substrate, the peripheral portion surrounding the central portion; a semiconductor layer formed within the aperture, and attaching to at least a portion of the central portion and to an upper surface of the liquid-philic layer; and a pair of electrodes that are in contact with an area of the semiconductor layer, the area of the semiconductor layer not overlapping the liquid-philic layer in plan view, wherein the bank has a liquid-phobic lateral surface surrounding the aperture, and the upper surface of the liquid-philic layer has a higher degree of liquid-philicity than the upper surface of the substrate.

Effects

An electronic device pertaining to one aspect of the present disclosure include: a bank defining an aperture from which an area of the upper surface of the substrate is exposed; and a liquid-philic layer formed on a peripheral portion of the area of the upper surface of the substrate, and not overlapping a central portion of the area of the upper surface of the substrate, the peripheral portion surrounding the central portion. In other words, the liquid-philic layer is formed on the peripheral area of the bottom of the aperture. Furthermore, the upper surface of the liquid-philic layer has a higher degree of liquid-philicity than the upper surface of the substrate. This configuration prevents the semiconductor ink near the lateral surface of the bank surrounding the aperture from climbing the lateral surface. The semiconductor ink is retained at the bottom of the aperture, and consequently the semiconductor layer has a sufficient film thickness in the central area within the aperture.

Thus the electronic device pertaining to one aspect of the present disclosure has a semiconductor layer having a desirable cross-sectional shape.

DESCRIPTION OF EMBODIMENTS

Figure 1:
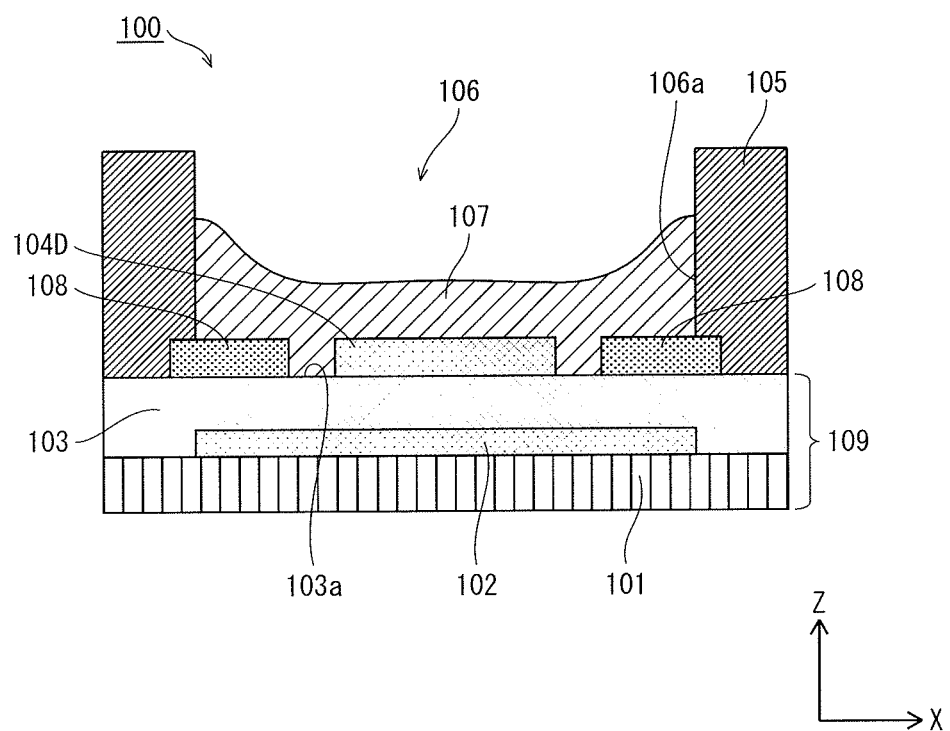
FIG. 1 is a schematic cross-sectional view illustrating a configuration of a thin-film transistor (TFT) 100 pertaining to Embodiment 1.

<<Outline of an Aspect of the Present Invention>>

One aspect of the present invention is an electronic device comprising: a substrate; a bank formed on an upper surface of the substrate, surrounding an area of the upper surface of the substrate, and defining an aperture from which the area of the upper surface is exposed; a liquid-philic layer formed on a peripheral portion of the area of the upper surface of the substrate, and not overlapping a central portion of the area of the upper surface of the substrate, the peripheral portion surrounding the central portion; a semiconductor layer formed within the aperture, and attaching to at least a portion of the central portion and to an upper surface of the liquid-philic layer; and a pair of electrodes that are in contact with an area of the semiconductor layer, the area of the semiconductor layer not overlapping the liquid-philic layer in plan view, wherein the bank has a liquid-phobic lateral surface surrounding the aperture, and the upper surface of the liquid-philic layer has a higher degree of liquid-philicity than the upper surface of the substrate.

At least one of the pair of electrodes may be formed on the upper surface of the substrate.

Said at least one of the pair of electrodes may be separated from the liquid-philic layer, and the liquid-philic layer may include a same material as said at least one of the pair of electrodes.

The liquid-philic layer may have a same film thickness as said at least one of the pair of electrode.

The liquid-philic layer may have a smaller film thickness than said at least one of the pair of electrodes.

The pair of electrodes may be composed of a source electrode and a drain electrode, and may be formed on the upper surface of the substrate or on an upper surface of the semiconductor layer, with an interval therebetween.

The source electrode and the drain electrode may be formed on the upper surface of the substrate.

The substrate may be a laminate including a base, a gate electrode formed on the base, and a gate insulation layer covering the gate electrode, and the source electrode and the drain electrode may be formed on an upper surface of the gate insulation layer.

One of the pair of electrodes may be formed on the central portion of the area of the upper surface of the substrate, and the other one of the pair of electrodes may be formed on a portion of an upper surface of the semiconductor layer, the portion of the upper surface of the semiconductor layer overlapping the central portion of the area of the upper surface of the substrate in plan view.

Another aspect of the present invention is an electronic device manufacturing method comprising: preparing a substrate; forming a bank on an upper surface of the substrate, the bank surrounding an area of the upper surface of the substrate, defining an aperture from which the area of the upper surface is exposed, and having a liquid-phobic lateral surface surrounding the aperture; forming a liquid-philic layer on a peripheral portion of the area of the upper surface of the substrate, the liquid-philic layer not overlapping a central portion of the area of the upper surface of the substrate, the peripheral portion surrounding the central portion, and the liquid-philic layer having a higher degree of liquid-philicity than the upper surface of the substrate; forming a semiconductor layer attaching to at least a portion of the central portion and to an upper surface of the liquid-philic layer; and forming a pair of electrodes that are in contact with an area of the semiconductor layer, the area not overlapping the liquid-philic layer in plan view.

At least one of the pair of electrodes may be formed on the upper surface of the substrate, and may be separated from the liquid-philic layer, and the liquid-philic layer may be formed simultaneously with said at least one of the pair of electrodes.

Embodiment 1

Overall Configuration

Figure 2:
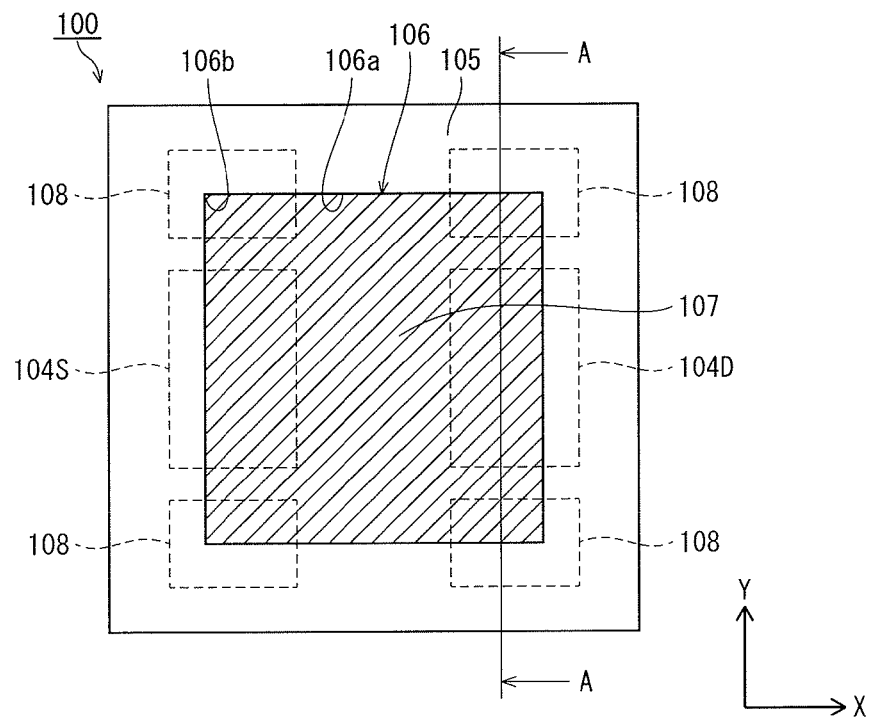
FIG. 2 is a schematic top view illustrating the configuration of the TFT 100 pertaining to Embodiment 1.

FIG. 1 is a schematic cross-sectional view illustrating a configuration of a thin-film transistor (TFT) 100 pertaining to Embodiment 1. FIG. 2 is a schematic top view illustrating the configuration of the TFT 100 pertaining to Embodiment 1. Note that FIG. 1 illustrates a cross section along the line A-A shown in FIG. 2, viewed in the direction indicated by the arrows.

As shown in FIG. 1 and FIG. 2, the TFT 100 includes a base 101, a gate electrode 102, a gate insulation layer 103, a source electrode 104S, a drain electrode 104D, a bank 105, a semiconductor layer 107 and liquid-philic layers 108. In the present embodiment, a bottom contact-bottom gate type TFT is taken as an example for explanation.

[Components]

<Base 101>

The base 100 is a base member for the TFT 100 and may be formed from an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

The TFT 100 may be used as a driving element in a flexible display, and if this is the case, the base 101 may be formed from a flexible material. For example, a plastic film formed from polyimide, polyester, polytetrafluoroethylene, polyphenylene sulfide, polyamide, polyamide-imide, polycarbonate, polystyrene, polypropylene, polyethylene, polyvinyl chloride, polyethersulfone, or polyethylene naphthalene may be used as the flexible material. The base 101 may be a multi-layer lamination film formed from one or more of the aforementioned materials.

<Gate Electrode 102>

As shown in FIG. 1, the gate electrode 102 is formed on the base 101. The gate electrode 102 has a single layer structure formed from a single electrically-conductive material such as a metal material or an alloy material, or a multilayer structure in which layers of a plurality of electrically-conductive materials are laminated. The electrically-conductive material of the gate electrode 102 is, for example, Mo (molybdenum), Al (aluminum), Cu (copper), W (tungsten), Ti (titanium), Cr (chromium), or MoW (molybdenum tungsten).

As shown in FIG. 1 and FIG. 2, the gate electrode 102 of the TFT 100 pertaining to the present embodiment is formed to have a larger area than the source electrode 104S and the drain electrode 104D in plan view. However, there is no restrictions as to the magnitude relationship among the gate electrode 102, the source electrode 104S and the drain electrode 104D, and the areas thereof are determined such that the channel area of the TFT 100 is effectively supplied with a voltage.

<Gate Insulation Layer 103>

As shown in FIG. 1, the gate insulation layer 103 is formed on the base 101 so as to cover the gate electrode 102. The gate insulation layer 103 is formed from, for example, a single layer of a silicone oxide film or silicon nitride film, or a multilayer of these films. The material of the gate insulation layer 103 is not limited to inorganic insulating materials, and may be organic insulating materials such as polyimide, polyvinyl phenol, polypropylene or polystyrene.

In the present embodiment, the base 101, the gate electrode 102 and the gate insulation layer 103 constitutes a substrate 109. In other words, the substrate 109 includes the base 101, the gate electrode 102 formed on the base 101, and the gate insulation layer 103 covering the gate electrode 102, which are layered in the stated order.

<Source Electrode 104S and Drain Electrode 104D>

Figure 3:
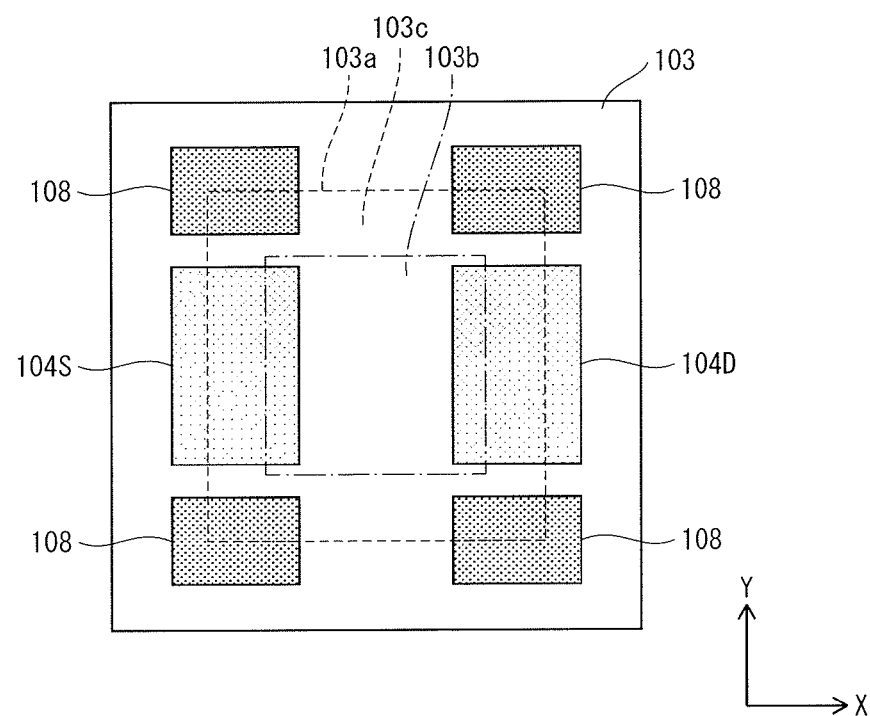
FIG. 3 is a schematic top view illustrating the configuration of the TFT 100 before formation of a bank 105 and a semiconductor layer 107.

FIG. 3 is a schematic top view illustrating the configuration of the TFT 100 before formation of the bank 105 and the semiconductor layer 107. As shown in FIG. 2 and FIG. 3, the source electrode 104S and the drain electrode 104D is a pair of electrodes which are formed on the upper surface of the gate insulation layer 103 (i.e. the upper surface of the substrate 109) so as to be separated from each other. As shown in FIG. 1 and FIG. 2, the source electrode 104S and the drain electrode 104D are in physical contact with the semiconductor layer 107, and hence the source electrode 104S and the drain electrode 104D are electrically connected to the semiconductor layer 107. Further, as shown in FIG. 1 through FIG. 3, each of the source electrode 104S and the drain electrode 104D is formed to be separated from the liquid-philic layers 108, which are described below.

Each of the source electrode 104S and the drain electrode 104D has a single layer structure formed from a single electrically-conductive material such as a metal material or an alloy material, or a multilayer structure in which layers of a plurality of electrically-conductive materials are laminated. The electrically-conductive material of the source electrode 104S and the drain electrode 104D is, for example, Mo, W, Cu, Al, Ni (nickel), Au (gold), Ag (silver), MoW, MoN (molybdenum nitride), or Pd (palladium). In addition, an electrically-conductive oxide such as ITO (indium tin oxide), IZO (indium zinc oxide) or ITZO (indium tin zinc oxide) may be used.

Preferably, the work functions of the source electrode 104S and the drain electrode 104D are greater than the energy level represented by the HOMO (highest occupied molecular orbital) level or the electron affinity of the semiconductor layer 107. It is also preferable that the contact resistance between the source electrode 104S and the semiconductor layer 107 and the contact resistance between the drain electrode 104D and the semiconductor layer 107 are as small as possible. To reduce the contact resistances, the source electrode 104S and the drain electrode 104D may be formed as SAMs (self-assembled monolayers) or be subject to a surface treatment such as a UV (ultraviolet) ozone treatment so as to equalize the HOMO level of the semiconductor layer 107 and the work functions of the source electrode 104S and the drain electrode 104D.

Generally, the work function of a p-type semiconductor is approximately 5.0 eV. Therefore, it is possible to realize a preferable ohmic contact with the semiconductor layer 107 by forming the source electrode 104S and the drain electrode 104D from Au (having a work function of 5.1 eV), MoWOx (having a work function of 5.3 eV), or Ni (having a work function of 5.2 eV), for example. Furthermore, the use of these materials realizes a TFT having a low ON resistance and exhibiting excellent ON-state properties.

Figure 4:
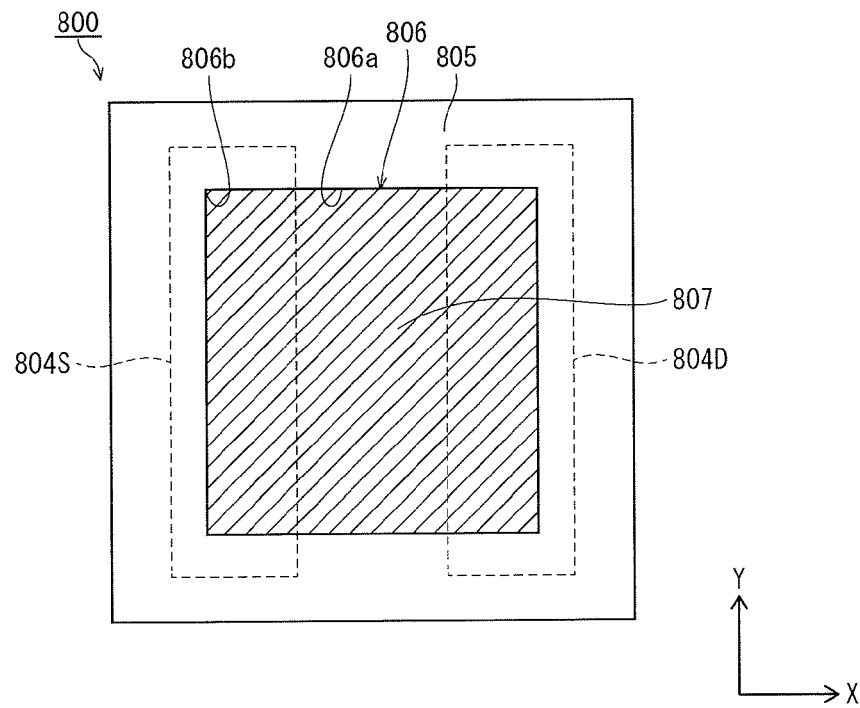
FIG. 4 is a schematic top view illustrating a configuration of a TFT 800 pertaining to a comparative example.

FIG. 4 is a schematic top view illustrating a configuration of a TFT 800 pertaining to a comparative example. As shown in FIG. 4, the TFT 800 includes a source electrode 804S, a drain electrode 804D, a bank 805 defining an aperture 806, and a semiconductor layer 807. As shown in FIG. 4, the source electrode 804S and the drain electrode 804D pertaining to the comparative example are, in plan view, located so as to overlap the lateral surface (e.g. a portion 806a) of the bank 805 surrounding the aperture 806 and corners 806b of the aperture 806. The inventors have found that when the source electrode 804S and the drain electrode 804D are located as in the comparative example, there are possibilities that it is impossible to obtain an excellent transistor. That is, the film thickness of the semiconductor layer 807 is likely to be large near the inner edge of the aperture 806. This means that, in the comparative example, the large-thickness portion of the semiconductor layer 807 is included in the channel area of the transistor, which would lead to degradation of the properties of the transistor.

In contrast, according to the present embodiment, the source electrode 104S and the drain electrode 104D are, in plan view, located so as not to overlap the corners 106b of the aperture 106. Furthermore, since the longitudinal ends of each of the source electrode 104S and the drain electrode 104D are separated from the lateral surface (e.g. a portion 106a), portions of the semiconductor layer 807 near the lateral surface are unlikely to be included in the channel area. With this structure, the large-thickness portion of the semiconductor layer 107 is not included in the channel area of the transistor, which realizes desired properties of the transistor.

<Bank 105, Aperture 106>

As shown in FIG. 1, the bank 105 is formed on the upper surface of the gate insulation layer 103, i.e. the upper surface of the substrate 109. As shown in FIG. 2, the bank 105 surrounds a portion of the upper surface of the substrate 109, thereby defining the aperture 106 from which the portion of the upper surface is exposed. Note that, in the present description, the aperture 106 defined by the bank 105 is a space surrounded by the lateral surface of the bank 105. The bank 105 defines the area where the semiconductor layer 107 is to be formed, and the semiconductor layer 107 is thus formed within the aperture 106. In the present embodiment, the upper surface of the substrate 109 is the upper surface of the gate insulation layer 103. Therefore, "a portion of the upper surface of the substrate 109" is "a portion of the upper surface of the gate insulation layer 103". In FIG. 3, this portion is depicted as an area 103a, which is surrounded by a dotted line.

As shown in FIG. 1 and FIG. 2, in plan view of the TFT 100, a portion of the source electrode 104S and a portion of the drain electrode 104D are exposed from the aperture 106. The semiconductor layer 107 is formed within the aperture 106 in such a state, and therefore the semiconductor layer 107 comes in contact with the portion of the source electrode 104S and the portion of the drain electrode 104D.

Since semiconductor ink is to be applied within the aperture 106, the lateral surface of the bank 105 facing the aperture 106 is formed to be liquid-phobic. Methods of giving liquid-phobicity to the lateral surface of the bank 105 include a method of forming the bank 105 from fluorine-containing material, and a method of applying a fluorine gas treatment to the lateral surface.

<Semiconductor Layer 107>

The semiconductor layer 107 is formed within the aperture 106. As shown in FIG. 2 and FIG. 3, the semiconductor layer 107 is attached to at least a portion of a central area 103b of the upper surface of the gate insulation layer 103. The central area 103b is located at the central portion of the area 103a of the upper surface of the gate insulation layer 103, and serves as the channel area of the TFT 100.

As described below, in the present embodiment, the liquid-philic layers 108 are formed on the area 103a of the upper surface of the gate insulation layer 103. Due to the liquid-philic layers 108, the central area 103b of the semiconductor layer 107 pertaining to the present embodiment, which serves as the channel area of the TFT 100, has a large thickness, compared to a TFT without the liquid-philic layers 108. Therefore, this configuration prevents malfunction of the TFT 100 caused by an insufficient film thickness of the central area 103b.

Although the film thickness of the semiconductor layer 107 is not limited to any particular value, the thickness needs to be sufficient for preventing disconnections of the semiconductor layer 107 due to the presence of the source electrode 104S and the drain electrode 104D. For this reason, the film thickness of the semiconductor layer 107 is preferably twice the film thickness of the source electrode 104S and the drain electrode 104D, and falls within the range of approximately 25 nm to approximately 100 nm, for example.

The material of the semiconductor layer 107 is, for example, a soluble organic material containing pentacene, phthalocyanine or porphyrin. Alternatively, a precursor of pentacene, phthalocyanine or porphyrin may be used, which is converted into pentacene, phthalocyanine or porphyrin by heat or light. Furthermore, an oxide such as InGaZnO containing indium (In), gallium (Ga) and zinc (Zn) may be used.

<Liquid-Philic Layers 108>

The liquid-philic layers 108 are used for achieving an appropriate cross-sectional shape of the semiconductor layer 107. As shown in FIG. 3, each liquid-philic layer 108 is located such that a portion thereof overlaps a peripheral area 103c of the upper surface of the gate insulation layer 103. The peripheral area 103c is an area surrounding the central area 103b of the upper surface of the gate insulation layer 103. In other words, the peripheral area 103c is an area within the area 103a excluding the central area 103b. In this way, the liquid-philic layers 108 are formed so as not to overlap the central area 103b in the area 103a of the upper surface of the gate insulation layer 103. As described above, the source electrode 104S and the drain electrode 104D are formed on the upper surface of the substrate 109, and similarly, the liquid-philic layers 108 are formed on the upper surface of the substrate 109. In other words, the liquid-philic layers 108 and the source electrode 104S and the drain electrode 104D are formed on the same surface.

Since the source electrode 104S, the drain electrode 104D and the liquid-philic layers 108 are formed on the same surface (i.e. on the upper surface of the substrate 109), the source electrode 104S, the drain electrode 104D and the liquid-philic layers 108 can be formed from the same material in the same manufacturing process. This is advantageous in reduction of cost and improvement in manufacturing efficiency.

Furthermore, the stated configuration reduces the differences in level of the source electrode 104S, the drain electrodes 104D and the liquid-philic layers 108 (i.e. the differences in height of the upper surfaces of the source electrode 104S, the drain electrodes 104D and the liquid-philic layers 108 with respect to the upper surface of the substrate 109). Therefore, the stated configuration reduces unevenness of the upper surface of the semiconductor layer 107 and variations in the thickness of the semiconductor layer 107, thereby reducing variations in the semiconductor properties.

Note that the source electrode 104S, the drain electrode 104D and the liquid-philic layers 108 are not necessarily formed directly on the upper surface of the substrate 109. For example, another member may be provided between the substrate 109 and some or all of the source electrode 104S, the drain electrode 104D, and the liquid-philic layers 108. In this case, if the liquid-philic layers 108 overlap at least either one of the source electrode 104S or the drain electrode 104D in side view, the differences in level of the source electrode 104S, the drain electrode 104D and the liquid-philic layers 108 can be reduced to be relatively small. Therefore, the stated configuration reduces the unevenness of the upper surface of the semiconductor layer 107 and the variations in the thickness of the semiconductor layer 107, thereby reducing the variations in the semiconductor properties.

Note that when another member is commonly located between the substrate 109 and each of the source electrode 104S, the drain electrode 104D and the liquid-philic layer 108, the member may be considered as a part of the substrate 109. For example, when a passivation film is uniformly formed on the gate insulation layer 103, the passivation film may be considered as a part of the substrate 109.

Furthermore, the bank 105 pertaining to the present embodiment is not necessarily formed directly on the upper surface of the substrate 109. Another member may be provided between the bank 105 and the substrate 109. When the member between the bank 105 and the substrate 109 is also commonly located between the substrate 109 and each of the source electrode 104S, the drain electrode 104D and the liquid-philic layers 108, the member may be considered as a part of the substrate 109 as with the case described above. When the member between the bank 105 and the substrate 109 is not located between the substrate 109 and any of the source electrode 104S, the drain electrode 104D and the liquid-philic layers 108, the member may be considered as a part of the bank 105.

As shown in FIG. 1 and FIG. 2, in plan view of the TFT 100, a portion of each liquid-philic layer is exposed from the aperture 106. The semiconductor layer 107 is formed within the aperture 106 in such a state, and therefore the semiconductor layer 107 is attached to the upper surface of the portion of each liquid-philic layer 108.

Note that the gate electrode 102, the gate insulation layer 103, the source electrode 104S, the drain electrode 104D and the semiconductor layer 107 are essential elements of the TFT 100 for fulfilling the functions of a transistor, whereas the liquid-philic layers 108 are not essential. The liquid-philic layers 108 are not supplied with voltage, unlike the gate insulation layer 103, the source electrode 104S or the drain electrode 104D. Furthermore, the liquid-philic layers 108 are electrically insulated from the gate insulation layer 103, the source electrode 104S and the drain electrode 104D.

The upper surfaces of the liquid-philic layers 108 have a higher degree of liquid-philicity than the upper surface of the substrate 109. Note that the term "liquid-philicity" used here means an affinity for the semiconductor ink. In the present embodiment, the liquid-philic layers 108 have a higher degree of liquid-philicity than the upper surface of the gate insulation layer 103. The material of the liquid-philic layers 108 suffices if it has a higher degree of liquid-philicity than the material of the gate insulation layer 103, and may be selected from among organic materials, inorganic materials and metal materials, for example. The material may be an electrically-conductive material, or electrically-nonconductive material.

The liquid-philic layers 108 of the present embodiment are formed from the same metal material as the source electrode 104S and the drain electrode 104D. In addition, as shown in FIG. 1, the liquid-philic layers 108 have the same film thickness as the source electrode 104S and the drain electrode 104D. With such a configuration, the liquid-philic layers 108 can be formed during the process of forming the source electrode 104S and the drain electrode 104D. Therefore, there is no need to perform an additional process for forming the liquid-philic layers 108, and formation of the liquid-philic layers 108 does not degrade the efficiency in manufacturing the TFT 100.

<Other Considerations>

Although not depicted in the drawings, a protection film is formed on the upper surface of the semiconductor layer 107, which is for protecting the semiconductor layer 107 from water, oxygen and impurities, for example. The material of the protection film is, for example, silicon dioxide or silicon nitride. Alternatively, an organic material or a high-polymer material may be used, which can effectively block water, oxygen, and so on.

Alternatively, the material of the protective layer may be a photo-crosslinked material. A photo-crosslinked material has a closely-packed molecular configuration in which molecular binding has been caused by irradiation of light. Such a configuration effectively block water, oxygen, and so on. Examples of the photo-crosslinked material include an acryl-containing material and a styrene-containing material. Instead of a photo-crosslinked material, a thermal-crosslinked material or combinations of photo-crosslinked materials and thermal-crosslinked materials may be used as the material of the protective layer.

Furthermore, any of the aforementioned inorganic materials may be added to any of the aforementioned organic materials. A protective layer having such a composition more effectively blocks water, oxygen, and so on, compared to a protective layer containing only organic material. In addition, the material of the protective layer may be colored so that the protective layer has light-blocking effect.

[Effect of Formation of Liquid-philic Layers 108]

Due to the liquid-philic layers 108, the semiconductor layer 107 has a sufficient film thickness in the central area within the aperture 106 compared to when the liquid-philic layers 108 are not formed, and accordingly the semiconductor layer 107 has an appropriate cross-sectional shape. The following explains the details of this effect in comparison with a comparative example.

Comparative Example

Figure 5:
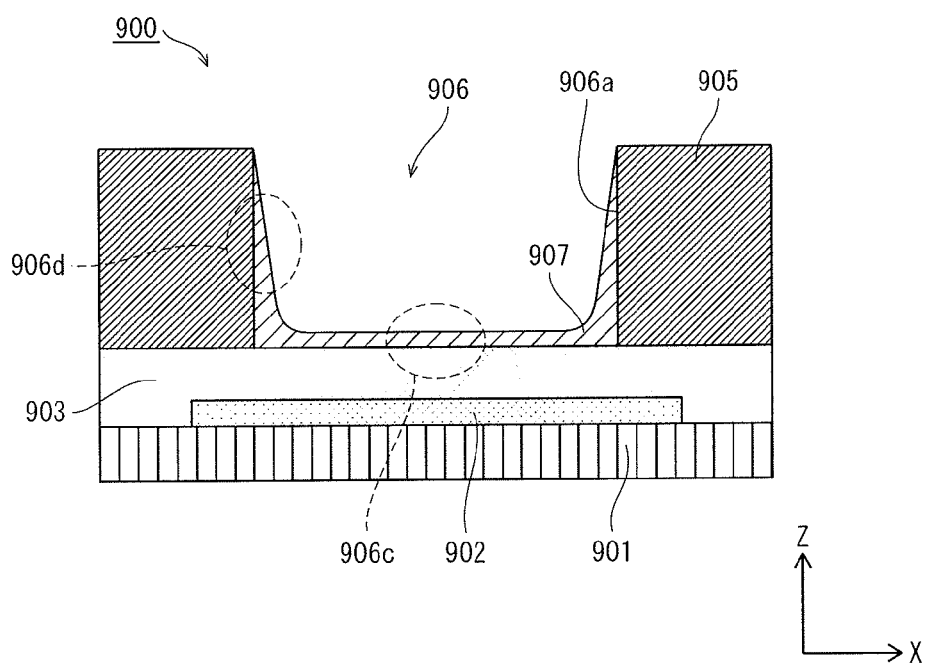
FIG. 5 is a schematic cross-sectional view illustrating a configuration of a TFT 900 pertaining to a comparative example.
Figure 28:
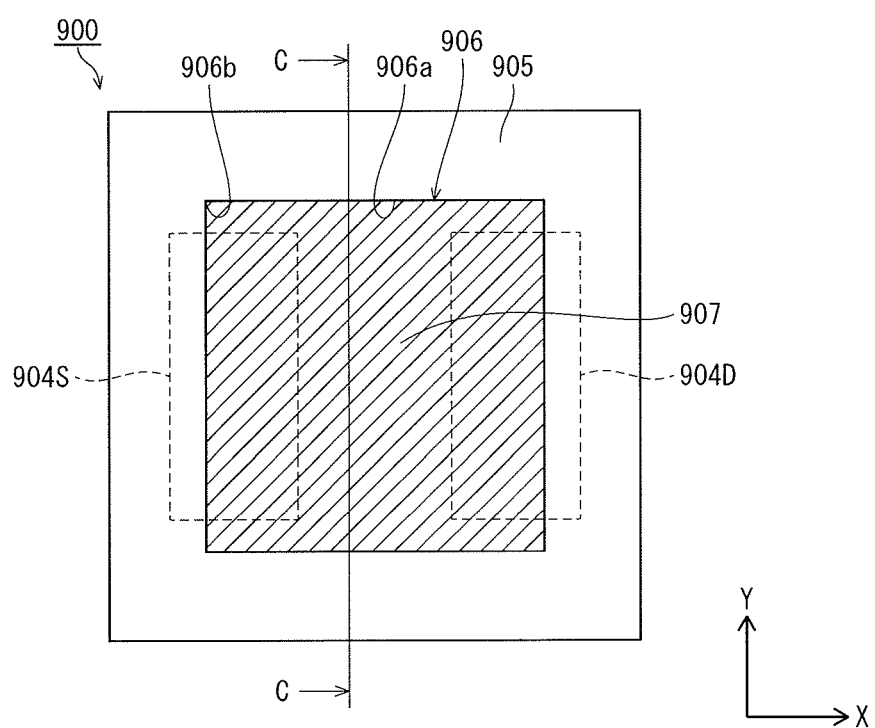
FIG. 28 is a schematic top view illustrating an example configuration of a common coating-type TFT 900.

This section explains about a coating-type TFT 900 with no liquid-philic layer shown in FIG. 28, which serves as a comparative example. FIG. 5 is a schematic cross-sectional view illustrating a configuration of the TFT 900 pertaining to the comparative example. FIG. 5 illustrates a cross section along the line C-C shown in FIG. 28, viewed in the direction indicated by the arrows. Note that, in FIG. 5, 901 indicates the base, 902 indicates the gate electrode, and 903 indicates the gate insulation layer.

In a coating-type TFT, the lateral surface (e.g. a portion 906a) of the bank 905 surrounding the aperture 906 is formed to be liquid-phobic. Therefore, when semiconductor ink is applied within the aperture 906, a portion of the semiconductor ink near the lateral surface is likely to climb the lateral surface. Due to such movement of the semiconductor ink, in the semiconductor layer 907 formed by drying the solvent contained in the semiconductor ink, a portion in an area 909d near the inner edge of the aperture 906 is likely to have a large film thickness, as shown in FIG. 5.

On the other hand, the amount of a portion of the semiconductor ink located in a central area 906c within the aperture 906 is likely to be small, because the ink is likely to climb the lateral surface of the bank 905. Consequently, in the central area 906c within the aperture 906, the semiconductor layer 907 is likely to have a small film thickness. The portion of the semiconductor layer 907 in the central area 906c serves as a channel area of the transistor. Therefore, due to insufficient film thickness of the portion of the semiconductor layer 907 in the central area 906c, there are possibilities that it is impossible to obtain desired properties of the transistor.

Figure 6:
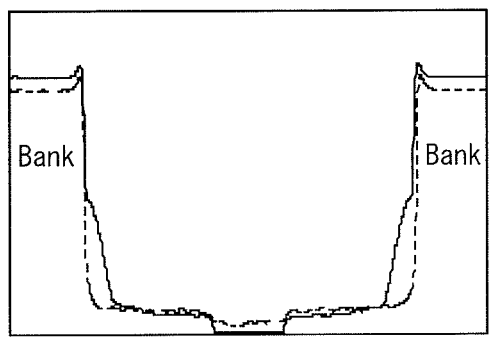
FIG. 6 is a diagram illustrating a cross-sectional shape of a semiconductor layer of a TFT.

FIG. 6 is a diagram illustrating a cross-sectional shape of the semiconductor layer of the TFT. In FIG. 6, the right and left ends represent the bank and the central area represents the aperture. The cross-sectional shape of the semiconductor layer pertaining to the comparative example is depicted as a solid line, and the cross-sectional shape of the semiconductor layer pertaining to the present embodiment is depicted as a dotted line. As shown in FIG. 6, climbing phenomenon of the semiconductor ink can be observed in the comparative example (solid line), near the lateral surface of the bank surrounding the aperture. As a result of this phenomenon, the semiconductor layer has a small film thickness in the central area within the aperture.

Figure 7:
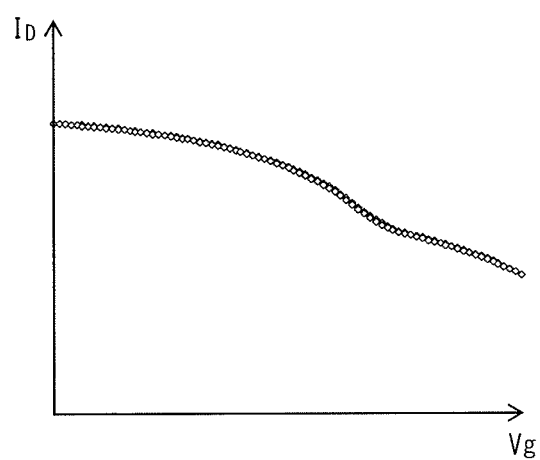
FIG. 7 is a graph illustrating a relationship between a gate voltage Vg and a drain current $I_D$ in a TFT having a semiconductor layer including a channel area with an insufficient film thickness.
Figure 8:
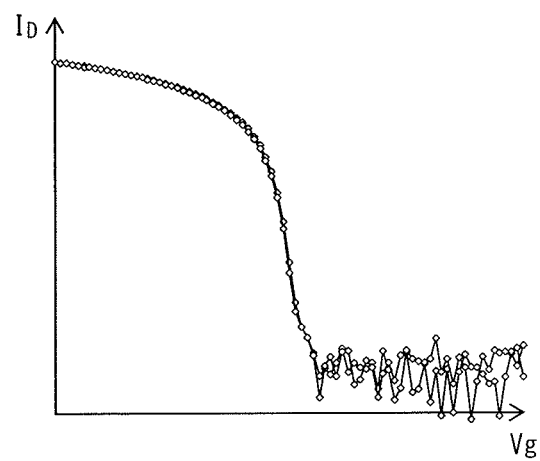
FIG. 8 is a graph illustrating a relationship between a gate voltage Vg and a drain current $I_D$ in a TFT having a semiconductor layer including a channel area with a sufficient film thickness.

Next, description is given to potential malfunction that might occur when the portion of the semiconductor layer that serves as the channel area does not have a sufficient film thickness. FIG. 7 is a graph illustrating a relationship between a gate voltage Vg and a drain current $I_D$ in a TFT having a semiconductor layer including a channel area having an insufficient film thickness. FIG. 8 is a graph illustrating a relationship between a gate voltage Vg and a drain current $I_D$ in a TFT having a semiconductor layer including a channel area having a sufficient film thickness. In each of FIG. 7 and FIG. 8, the horizontal axis represents the gate voltage Vg, and the vertical axis represents the drain current $I_D$.

As can be seen from FIG. 7 and FIG. 8, the TFT with a channel area having an insufficient film thickness (FIG. 7) cannot realize desired properties of the transistor, whereas the TFT with a channel area having a sufficient film thickness (FIG. 8) can realize desired properties of the transistor. As can be seen from these results, there are possibilities that it is impossible to obtain desired properties of the transistor due to the insufficient film thickness of the semiconductor layer 907 in the central area 906c within the aperture 906 (FIG. 5).

Generally, the material of the gate insulation layer 903 has a lower degree of liquid-philicity than the metal material of the source electrode 904S and the drain electrode 904D. Also, as shown in FIG. 28, the source electrode 904S and the drain electrode 904D are, in plan view, located so as not to overlap the corners 906b of the aperture 906. (This is common feature of the present embodiment and the comparative example). Therefore, when compared with the comparative example shown in FIG. 4, the source electrode 904S and the drain electrode 904D of the comparative example shown in FIG. 28 occupy small areas on the upper surface of the gate insulation layer 903. In other words, the exposed portion of the gate insulation layer 903 before formation of the bank 905 has a larger area than in the comparative example shown in FIG. 4. Therefore, due to the configuration for preventing a large-thickness portion of the semiconductor layer 107 from being included in the channel area of the transistor, a portion of the semiconductor ink near the lateral surface of the bank 905 surrounding the aperture 906 is more likely to climb the lateral surface. Consequently, in the central area 906c within the aperture 906, the semiconductor layer 907 is likely to have an even smaller film thickness.

Present Embodiment

As shown in FIG. 2 and FIG. 3, in the present embodiment, the source electrode 104S and the drain electrode 104D are, in plan view, located so as not to overlap the corners 106b of the aperture 106. In the present embodiment, the liquid-philic layers 108 are formed on areas saved by arranging the source electrode 104S and the drain electrode 104D so as not to overlap the corners 106b. Since the upper surface of each liquid-philic layer 108 has a higher degree of liquid-philicity than the upper surface of the gate insulation layer 103, and accordingly the liquid-philic layers 108 are likely to attract the semiconductor ink.

Such a configuration prevents the semiconductor ink from climbing the lateral surface (e.g. the portion 106a) of the bank 105 surrounding the aperture 106 while detouring around the upper surface of the gate insulation layer having a relatively high degree of liquid-phobicity. Thus, the semiconductor ink is kept on the bottom of the aperture 106. As a result, the stated configuration reduces the increase in film thickness of the semiconductor layer 107 near the inner edge of the aperture 106, and realizes a sufficient film thickness of the semiconductor layer 107 in the central area within the aperture 106.

As depicted as a dotted line in FIG. 6, in the present embodiment, the semiconductor ink does not climb the lateral surface of the bank, unlike in the comparative example (depicted as a solid line). As can be seen from the drawing, the semiconductor layer in the central area within the aperture has a sufficient film thickness.

[Method of Manufacturing TFT 100]

Figure 9:
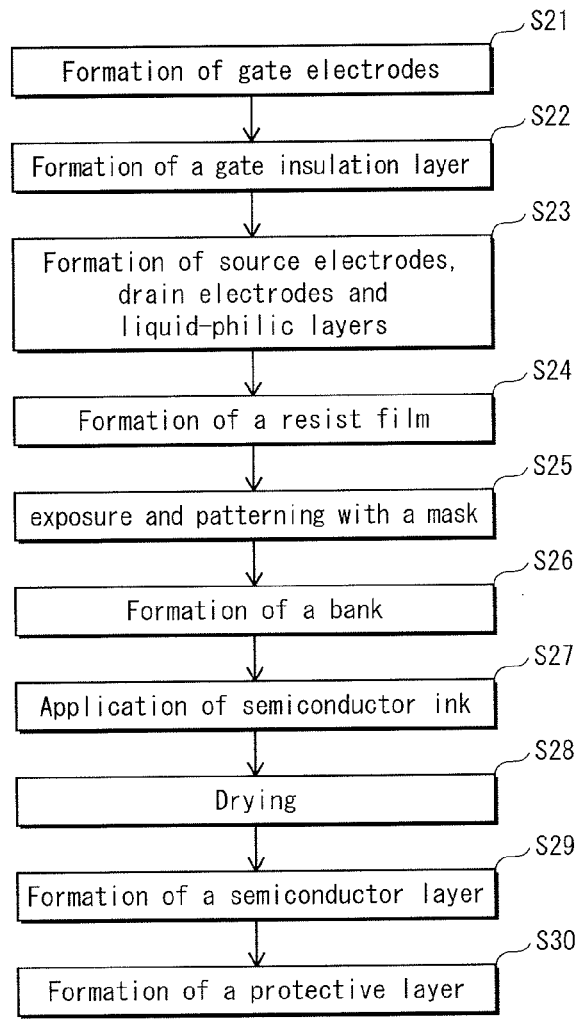
FIG. 9 is a flowchart used for explaining a method of manufacturing the TFT 100 pertaining to Embodiment 1.

The following describes a method of manufacturing the TFT 100 pertaining to the present embodiment, with reference to FIG. 9 through FIG. 17. FIG. 9 is a flowchart used for explaining a method of manufacturing the TFT 100 pertaining to Embodiment 1. FIG. 10 through FIG. 17 are schematic cross-sectional views used for explaining the method of manufacturing the TFT 100 pertaining to Embodiment 1.

Figure 10:
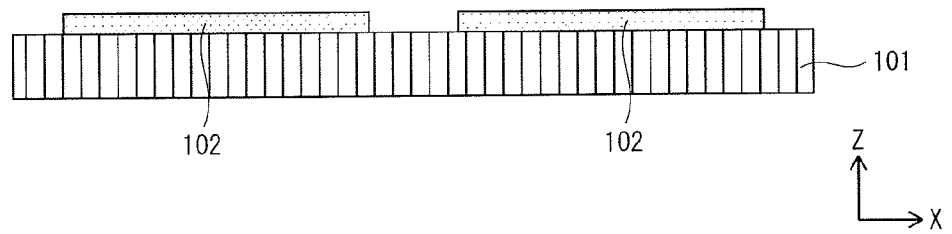
FIG. 10 is a schematic cross-sectional view used for explaining the method of manufacturing the TFT 100 pertaining to Embodiment 1.

As shown in step S21 in FIG. 9 and in FIG. 10, the gate electrodes 102 are formed on the upper surface of the base 101. First, the metal material of the gate electrode 102 is deposited on the upper surface of the base 101 by, for example, a sputtering method, a vapor deposition method or a printing method, in order to form a metal film thereon. Subsequently, the metal film is patterned by photolithography and etching. Thus the gate electrodes 102 each having a predetermined shape are formed on the upper surface of the base 101. Note that the etching applied to the metal film may be wet etching or dry etching.

Figure 11:
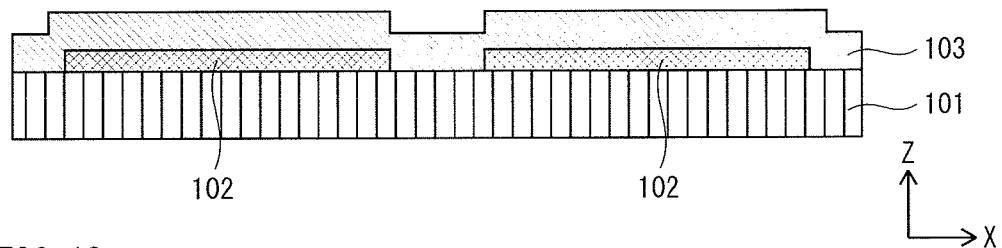
FIG. 11 is a schematic cross-sectional view used for explaining the method of manufacturing the TFT 100 pertaining to Embodiment 1.

Subsequently, as shown in step S22 of FIG. 9 and in FIG. 11, the gate insulation layer 103 is layered so as to cover the gate electrode 102 and the base 101. The gate insulation layer 103 may be formed by plasma chemical vapor deposition (CVD) or a coating method, depending on its material. For example, when the gate insulation layer 103 is an inorganic insulation film such as a silicone oxide film or a silicon nitride film, the gate insulation layer 103 may be formed by plasma CVD. When the gate insulation layer 103 is an organic insulation film such as a styrene-containing film, an imide-containing film, a polyvinyl phenol film or a polypropylene film, the gate insulation layer 103 may be formed by a coating method. By the processes shown in steps S21 and S22 of FIG. 9 and in FIG. 11 and FIG. 12, the substrate 109 (FIG. 1) is prepared.

After that, contact holes may be formed in the gate insulation layer 103. The contact holes are formed in order to electrically connect the gate electrodes of the TFT 100 with the source electrodes and the drain electrodes of another TFT that is adjacent to the TFT 100. When the gate insulation layer 103 is photosensitive and formed by a coating method, the contact holes may be formed by patterning via a photolithography method. When the gate insulation layer 103 is not photosensitive and formed by plasma CVD, the contact holes may be formed by dry etching or wet etching after pattering a resist.

Figure 12:
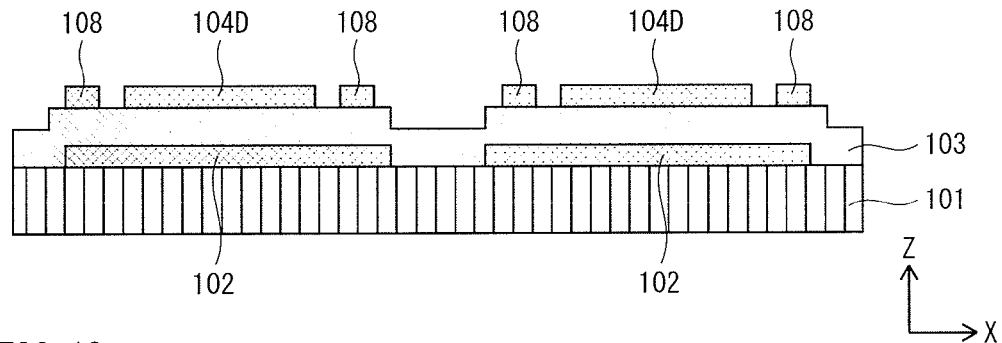
FIG. 12 is a schematic cross-sectional view used for explaining the method of manufacturing the TFT 100 pertaining to Embodiment 1.

Subsequently, as shown in step S23 of FIG. 9 and in FIG. 12, the source electrodes, the drain electrodes 104D and the liquid-philic layers 108 are formed on the upper surface of the gate insulation layer 103. Note that the source electrodes are not shown in FIG. 12 through FIG. 17 as they are hidden behind the drain electrodes 104D. First, the metal material of the source electrodes, the drain electrodes 104D and the liquid-philic layers 108 is deposited on the upper surface of the gate insulation layer 103 by, for example, a sputtering method, a vapor deposition method or a printing method, in order to form a metal film thereon. Subsequently, the metal film is patterned by photolithography and etching. Thus the source electrodes, the drain electrodes 104D and the liquid-philic layers 108, each having a predetermined shape, are formed on the upper surface of the gate insulation layer 103. The etching applied to the metal film may be wet etching or dry etching. This method achieves excellent manufacturing efficiency, because the liquid-philic layers 108 are formed simultaneously with the source electrodes and the drain electrodes 104D.

Figure 13:
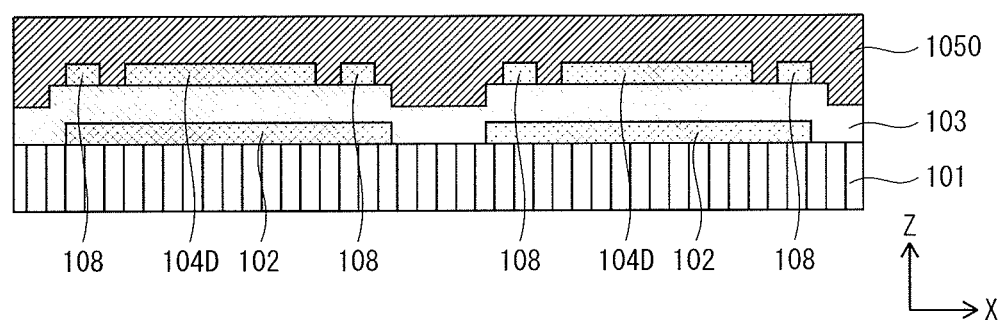
FIG. 13 is a schematic cross-sectional view used for explaining the method of manufacturing the TFT 100 pertaining to Embodiment 1.

Subsequently, as shown in step S24 of FIG. 9 and in FIG. 13, a photoresist material film 1050 for forming the bank 105 is deposited to cover the source electrodes, the drain electrodes 104D and the liquid-philic layers 108.

Figure 14:
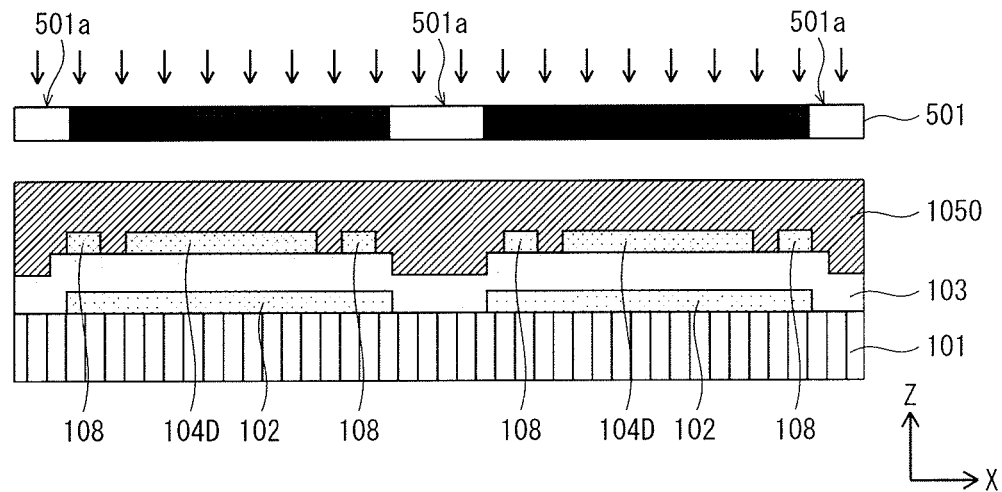
FIG. 14 is a schematic cross-sectional view used for explaining the method of manufacturing the TFT 100 pertaining to Embodiment 1.
Figure 15:
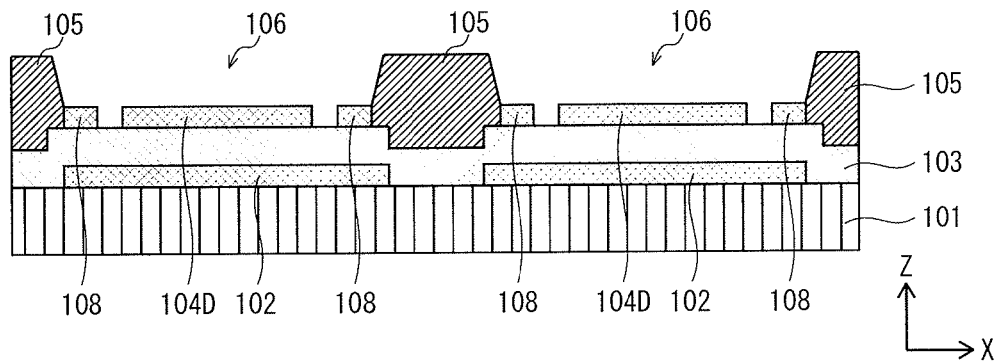
FIG. 15 is a schematic cross-sectional view used for explaining the method of manufacturing the TFT 100 pertaining to Embodiment 1.

Then, as shown in step S25 of FIG. 9 and in FIG. 14, a mask 501 is placed above the photoresist material film 1050 thus deposited. Note that the mask 501 has windows 501a where the banks 105 are to be formed. The banks 105, each surrounding a portion of the upper surface of the gate insulation layer 103 and each defining the aperture 106 from which the portion is exposed, are formed by performing exposure and patterning, with the mask 501 being placed above the photoresist material film 1050 (Step S26 of FIG. 9, and FIG. 15). Further, in order to give liquid-phobicity to the lateral surface (including the portion 106a shown in FIG. 1) of the bank 105 surrounding the aperture 106, the aforementioned surface treatment is applied to the lateral surface of the bank 105.

Figure 16:
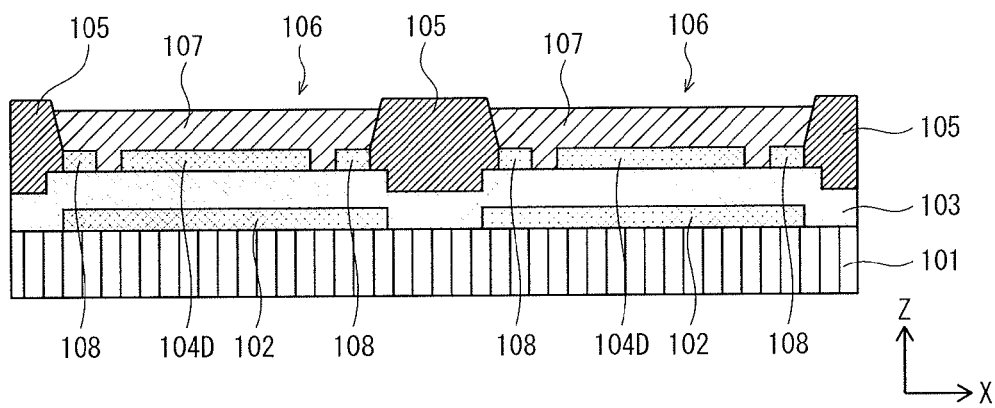
FIG. 16 is a schematic cross-sectional view used for explaining the method of manufacturing the TFT 100 pertaining to Embodiment 1.

Subsequently, as shown in step S27 of FIG. 9 and in FIG. 16, semiconductor ink is applied within the aperture 106, in order to form the semiconductor layers 107. The semiconductor ink spreads over portions of the upper surface of the gate insulation layer 103 exposed from the apertures 106, over portions of the upper surfaces of the source electrodes and the drain electrodes 104D exposed from the apertures 106, and over the upper surfaces of the liquid-philic layers 108.

Subsequently, as shown in step S28 of FIG. 9, the solvent contained in the semiconductor ink is dried. As a result, as shown in step S29 of FIG. 9 and in FIG. 16, the semiconductor layers 107 are formed within the apertures 106 so as to be attached to at least a portion of the central area 103b (FIG. 3) within each aperture 106 and to the upper surface of each liquid-philic layer 108. The source electrodes and the drain electrodes 104D come in contact with the semiconductor layers 107 within areas that do not overlap the liquid-philic layers 108 in plan view of the semiconductor layers 107.

Figure 17:
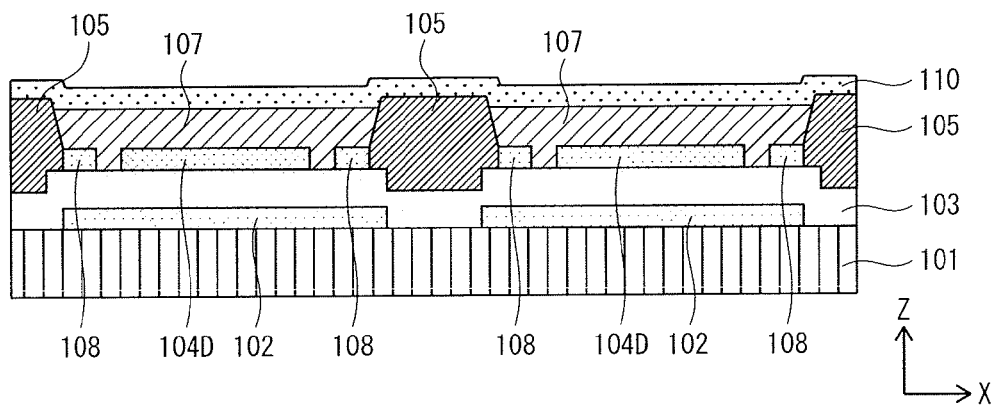
FIG. 17 is a schematic cross-sectional view used for explaining the method of manufacturing the TFT 100 pertaining to Embodiment 1.

Finally, as shown in step S30 of FIG. 9 and in FIG. 17, the protective layer 110 is formed to cover the surfaces of the semiconductor layers 107 and the banks 105, thereby completing the TFT 100 (FIG. 1).

Embodiment 2

The shapes of the source electrodes and the drain electrodes in plan view are not limited the shapes described in Embodiment 1.

Figure 18:
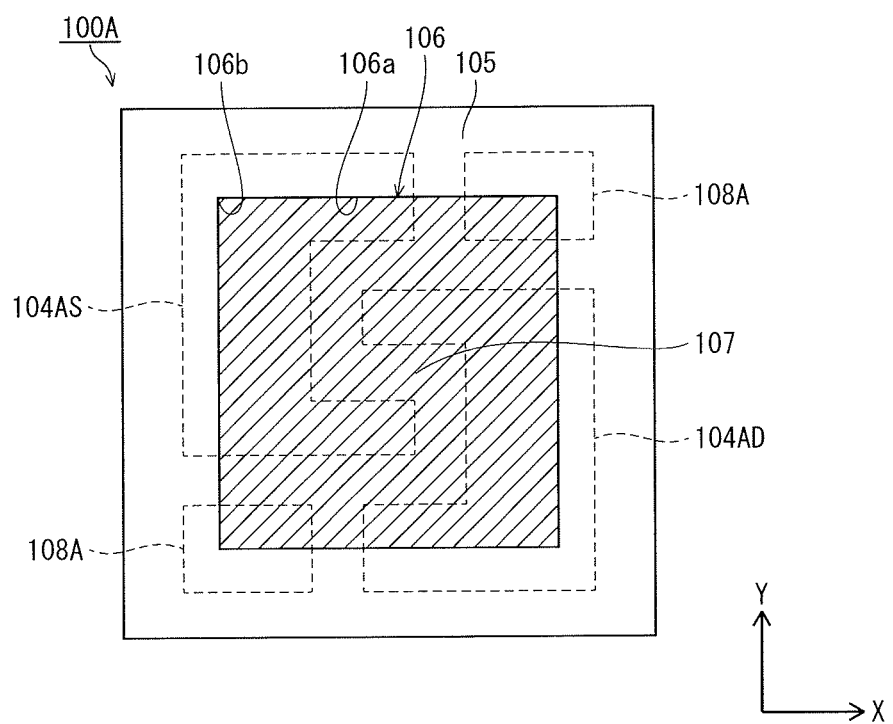
FIG. 18 is a schematic top view illustrating a configuration of a TFT 100A pertaining to Embodiment 2.

FIG. 18 is a schematic top view illustrating a configuration of a TFT 100A pertaining to Embodiment 2. In the following drawings, configuration elements which are the same as in Embodiment 1 are labeled using the same reference signs and explanation thereof is omitted.

The TFT 100A pertaining to the present embodiment is characterized by the shapes of the source electrodes and the drain electrodes in plan view. Specifically, a source electrode 104AS and a drain electrode 104AD pertaining to the present embodiment are formed in a comb-like pattern in plan view. Also, liquid-philic layers 108A are formed on the upper surface of the gate insulation layer. The liquid-philic layers 108A have a higher degree of liquid-philicity than the upper surface of the gate insulation layer. Note that the liquid-philic layers 108A serve the same function as the liquid-philic layers 108 of the Embodiment 1.

Furthermore, as in Embodiment 1, the source electrode 104AS and the drain electrode 104AD of the present embodiment are located so as not to overlap the corners 106b of the aperture 106. The following explains the advantages of this configuration, in comparison with a comparative example.

Figure 19:
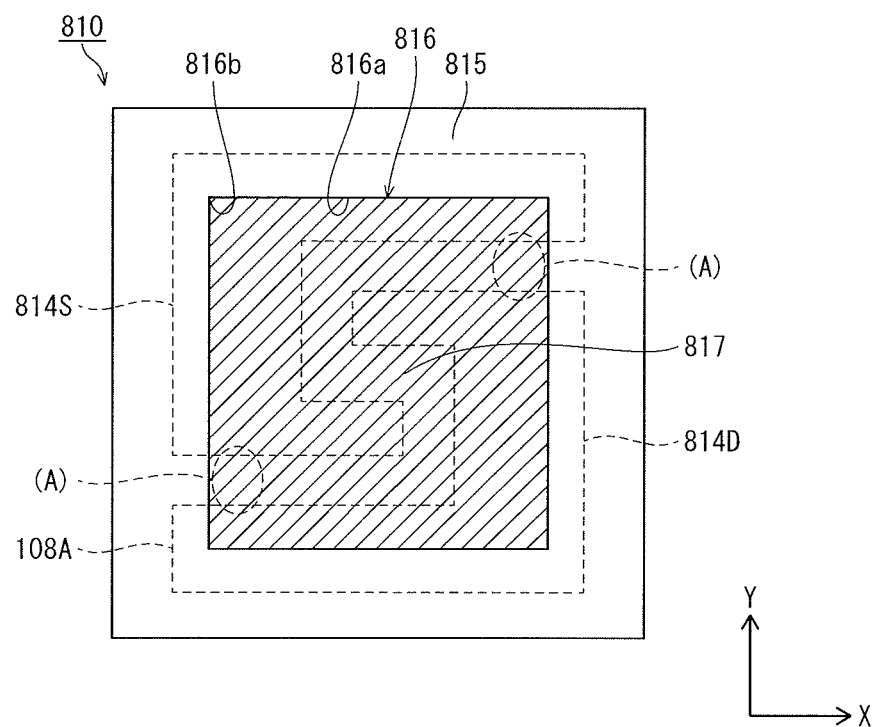
FIG. 19 is a schematic top view illustrating a configuration of a TFT 810 pertaining to a comparative example.

FIG. 19 is a schematic top view illustrating a configuration of a TFT 810 pertaining to a comparative example. As in the TFT 100A, a bank 815 of this comparative example defines an aperture 816, and a semiconductor layer 817 is formed within the aperture 816. However, unlike the TFT 100A, the source electrode 814S and the drain electrode 814D of the comparative example 810 are located so as to overlap the corners 816b of the aperture 816. Since the source electrode 814S and the drain electrode 814D are formed so as to overlap the corners 816b, the liquid-philic layers are not formed in this comparative example.

As explained above, when semiconductor ink is applied within the aperture 816, a portion of the semiconductor ink in the central area moves toward the lateral surface of the bank 815 surrounding the aperture 816. Therefore, the semiconductor layer 817 has a larger film thickness in the peripheral area within the aperture 816 than in the central area within the aperture 816. Furthermore, in some cases, a portion of the semiconductor ink would be retained in areas (A) shown in FIG. 19, and accordingly the semiconductor layer 817 has a larger film thickness in the areas (A) than in any other areas. Since the area A is surrounded on three sides by the lateral surface of the bank 815, an edge of the source electrode 814S and an edge of the drain electrode 814D, the semiconductor ink is likely to be retained in the area (A). Therefore, there are possibilities that a parasitic transistor occurs in the areas (A).

In contrast, according to the present embodiment, the source electrode 104AS and the drain electrode 104AD are located so as not to overlap the corners 106b of the aperture 106. In this configuration, there are no areas surrounded by: the lateral surface of the bank 105; an edge of the source electrode 104AS; and an edge of the drain electrode 104AD, and accordingly there are no possibilities of the occurrence of a parasitic transistor.

On the other and, due to such an arrangement of the source electrode 104AS and the drain electrode 104AD, the source electrode 104AS and the drain electrode 104AD occupy smaller areas on the upper surface of the gate insulation layer than in the comparative example shown in FIG. 19. Accordingly, a larger portion of the gate insulation layer is exposed from the aperture 106, and the semiconductor ink near the lateral surface of the bank 105 is more likely to climb the lateral surface. In the present embodiment, however, the liquid-philic layers 108A are formed in the areas resulting from reduction in size of the areas where the source electrode 104AS and the drain electrode 104AD are to be formed. The liquid-philic layers 108A prevents the semiconductor ink from climbing the lateral surface of the bank 105, and prevents the problem of insufficient film thickness of the semiconductor layer 107 in the central area within the aperture 106.

It should be noted here that even when the liquid-philic layers 108A are formed from metal material, the liquid-philic layers 108A cannot be a cause of the occurrence of a parasitic transistor, because the liquid-philic layers 108A are not supplied with voltage.

Embodiment 3

In Embodiments 1 and 2, a bottom contact-bottom gate type TFT is taken as an example for explanation. However, the present disclosure may be applied to TFTs of other types. The following explains example cases in which the present disclosure is applied to TFTs of other types.

Figure 20:
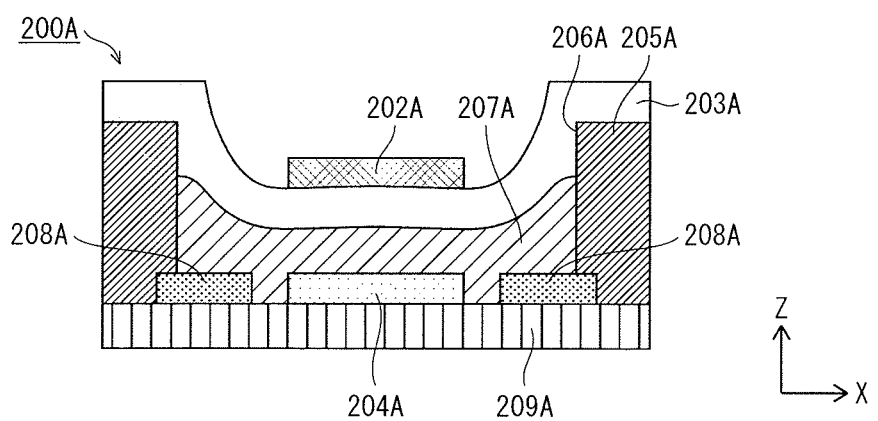
FIG. 20 is a schematic cross-sectional view illustrating a configuration of a TFT 200A pertaining to Example 1 of Embodiment 3.

FIG. 20 is a schematic cross-sectional view illustrating a configuration of a TFT 200A pertaining to Example 1 of Embodiment 3. The TFT 200A is a bottom contact-top gate type TFT. The TFT 200A includes, from bottom to top, a substrate 209A, a drain electrode 204A, liquid-philic layers 208A, a bank 205A, a semiconductor layer 207A, a gate insulation layer 203A and a gate electrode 202A. Note that the source electrode is not shown in FIG. 20 as it is hidden behind the drain electrode 204A. The semiconductor layer 207A is formed within an aperture 206A defined by the bank 205A so as to be attached to the upper surface of the drain electrode 204A, to the upper surface of the source electrode which is not depicted, and to the upper surfaces of the liquid-philic layers 208A.

Figure 21:
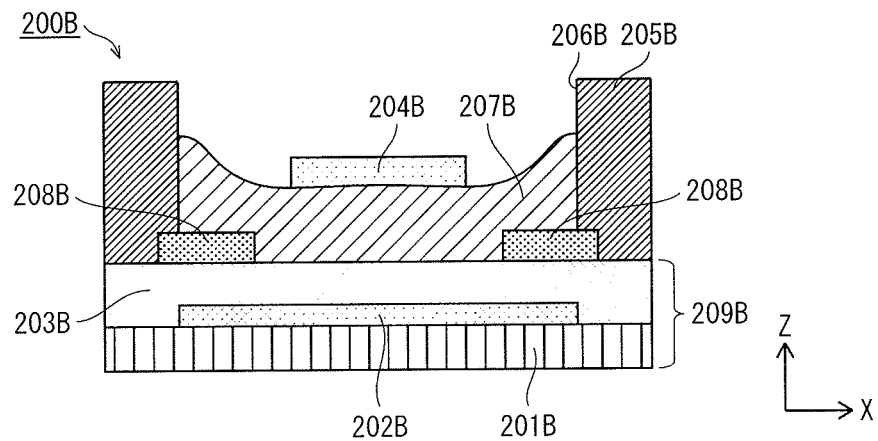
FIG. 21 is a schematic cross-sectional view illustrating a configuration of a TFT 200B pertaining to Example 2 of Embodiment 3.

FIG. 21 is a schematic cross-sectional view illustrating a configuration of a TFT 200B pertaining to Example 2 of Embodiment 3. The TFT 200B is a top contact-bottom gate type TFT. The TFT 200B includes, from bottom to top, a substrate 209B, liquid-philic layers 208B, a bank 205B, a semiconductor layer 207B and a drain electrode 204B. Note that the source electrode is not shown in FIG. 21 as it is hidden behind the drain electrode 204B. The substrate 209B also includes a base 201B, a gate electrode 202B formed on the upper surface of the base 201B, and a gate insulation layer 203B formed so as to cover the upper surface of the base 201B and the upper surface of the gate electrode 202B. The semiconductor layer 207B is formed within an aperture 206B defined by the bank 205B so as to be attached to the upper surfaces of the liquid-philic layers 208B.

Figure 22:
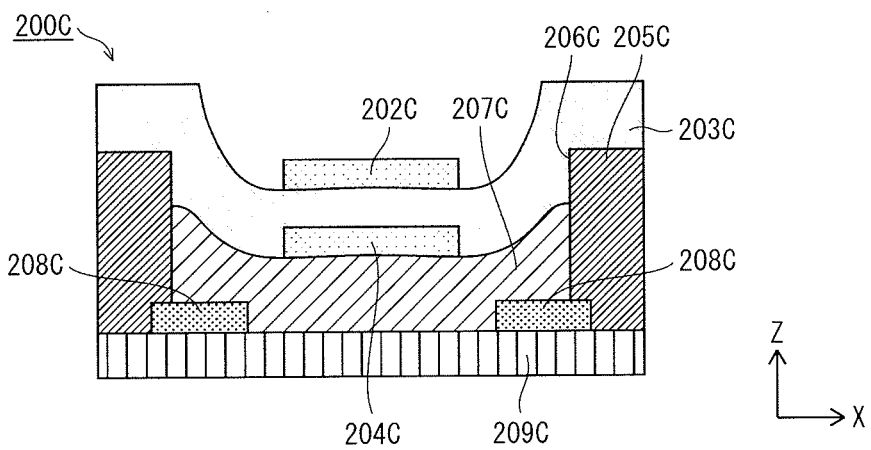
FIG. 22 is a schematic cross-sectional view illustrating a configuration of a TFT 200C pertaining to Example 3 of Embodiment 3.

FIG. 22 is a schematic cross-sectional view illustrating a configuration of a TFT 200C pertaining to Example 3 of Embodiment 3. The TFT 200C is a top contact-top gate type TFT. The TFT 200C includes, from bottom to top, a substrate 209C, liquid-philic layers 208C, a bank 205C, a semiconductor layer 207C, a drain electrode 204C, a gate insulation layer 203C, and gate electrode 202C. Note that the source electrode is not shown in FIG. 22 as it is hidden behind the drain electrode 204C. The semiconductor layer 207C is formed within an aperture 206C defined by the bank 205C so as to be attached to the upper surfaces of the liquid-philic layers 208C.

The same advantageous effects achieved in a bottom contact-bottom gate type TFT can be achieved in a bottom contact-top gate type TFT, a top contact-bottom gate type TFT and a top contact-top gate type TFT.

Embodiment 4

Embodiments 1 through 3 take a TFT as an example for explanation. The present disclosure is applicable not only to three-terminal electronic devices such as TFTs but also to other sorts of electronic devices. The present embodiment explains an example in which the present disclosure is applied to a light-emitting element.

Figure 23:
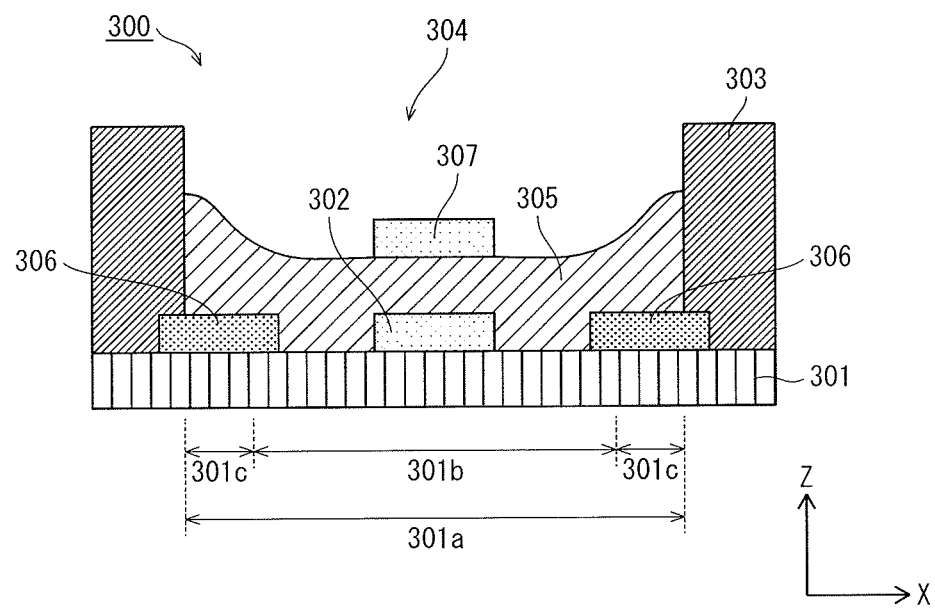
FIG. 23 is a schematic cross-sectional view illustrating a configuration of a light-emitting element 300 pertaining to Embodiment 4.
Figure 24:
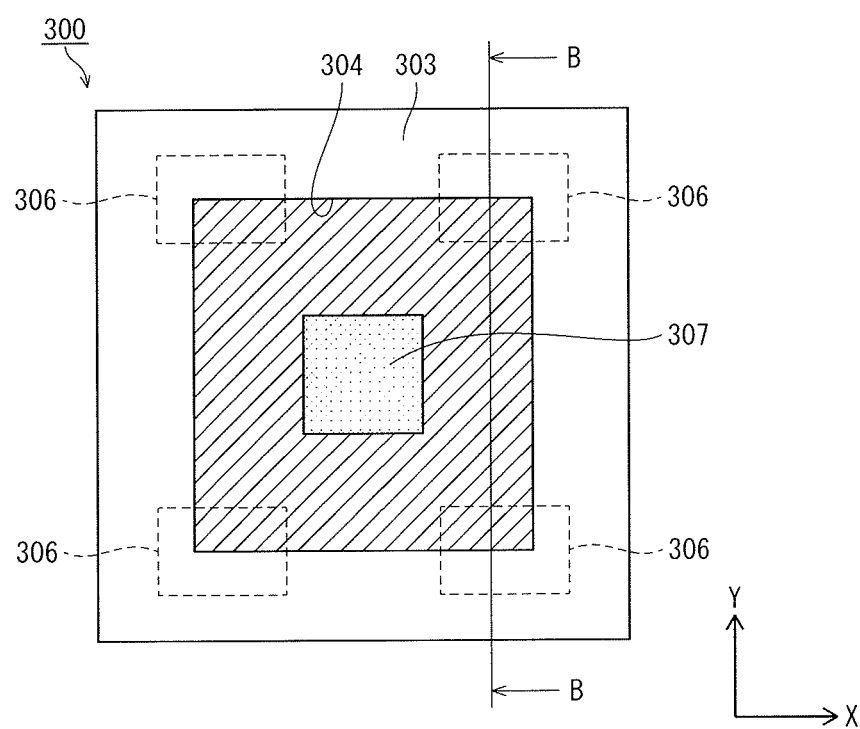
FIG. 24 is a schematic top view illustrating the configuration of the light-emitting element 300 pertaining to Embodiment 4.

FIG. 23 is a schematic cross-sectional view illustrating a configuration of a light-emitting element 300 pertaining to Embodiment 4. FIG. 24 is a schematic top view illustrating the configuration of the light-emitting element 300 pertaining to Embodiment 4. Note that FIG. 23 illustrates a cross section along the line B-B shown in FIG. 24, viewed in the direction indicated by the arrows.

As shown in FIG. 23 and FIG. 24, the light-emitting element 300 pertaining to the present embodiment includes a base 301, a lower electrode 302, a bank 303, a semiconductor layer 305, liquid-philic layers 306 and an upper electrode 307.

The base 301 is a substrate on which the bank 303 is to be formed, and serves as a base member for the light-emitting element 300. The material of the base 301 is, for example, glass, alumina, sapphire, or resin.

The lower electrode 302 serves as a cathode for injecting electrons into the semiconductor layer 305. The lower electrode 302 and the upper electrode 307 constitute a pair, and the lower electrode 302 serves as one of the pair of electrodes. As shown in FIG. 23, the lower electrode 302 is formed in a central area 301b on the upper surface of the base 301 serving as the substrate.

When the light-emitting element 300 emits light from the side closer to the upper electrode 307, the lower electrode 302 preferably serves as a reflector that reflects the light emitted from the semiconductor layer 305, which serves as a light-emitter of the light-emitting element 300, toward the upper electrode 307. The reflective material of the electrode is, for example, NiAu (An alloy of nickel and gold), ACL (an alloy of aluminum, cobalt and lanthanum), APC (an alloy of silver, palladium and copper), ARA (an alloy of silver, rubidium and gold), MoCr (an alloy of molybdenum and chromium) or NiCr (an alloy of nickel and chromium). On the other hand, when the light-emitting element 300 emits light from the side closer to the lower electrode 302, the lower electrode 302 needs to transmit the light emitted from the semiconductor layer 305, and therefore needs to be formed from a light-transmissive electrically-conductive material such as ITO or IZO (Indium Zinc Oxide).

As shown in FIG. 23, the bank 303 is formed on the upper surface of the base 301. The bank 303 surrounds a portion 301a of the upper surface of the base 301, and thereby defining an aperture 304 from which the portion 301a is exposed. The bank 303 defines the area where the semiconductor layer 305 is to be formed.

The semiconductor layer 305 serves as a light-emitter of the light-emitting element 300, and includes, from bottom to top, an n-type semiconductor layer and a p-type semiconductor layer. A p-n junction is created between the n-type semiconductor layer and the p-type semiconductor layer. The semiconductor layer 305 is formed in the following manner. First, semiconductor ink, prepared by dispersing semiconductor material for forming the n-type semiconductor layer in a solvent, is applied within the aperture 304, and is then dried. Then, a semiconductor ink, prepared by dispersing semiconductor material for forming the p-type semiconductor layer in a solvent, is applied within the aperture 304, and is then dried.

As shown in FIG. 23, the liquid-philic layers 306 are formed on a peripheral area 301c of the upper surface of the base 301. Also, as shown in FIG. 23 and FIG. 24, in plan view of the semiconductor layer 305, the liquid-philic layers 306 are located so as not to overlap the lower electrode 302 or the upper electrode 307. Note that the liquid-philic layers 306 serve the same function as the liquid-philic layers 108 of the Embodiment 1, namely the function of achieving an appropriate cross-sectional shape of the semiconductor layer 305. Therefore, the light-emitting element 300 can achieve the same advantageous effects as Embodiment 1.

The upper electrode 307 serves as an anode for injecting holes into the semiconductor layer 305. The upper electrode 307 serves as the other one of the pair of electrodes. As shown in FIG. 23, the upper electrode 307 is formed on the upper surface of the semiconductor layer 305 so as to overlap the central area 301b. When the light-emitting element 300 emits light from the side closer to the upper electrode 307, the upper electrode 307 needs to transmit the light emitted from the semiconductor layer 305, and therefore needs to be formed from a light-transmissive electrically-conductive material such as ITO or IZO. When the light-emitting element 300 emits light from the side closer to the lower electrode 302, the upper electrode 307 preferably serves as a reflector that reflects the light emitted from the semiconductor layer 305, toward the lower electrode 302. If this is the case, the upper electrode 307 is formed from a light-reflective electrode material, such as NiAu, ACL, APC, ARA, MoCr or NiCr.

Embodiment 5

The present embodiment describes a TFT in which the semiconductor layer has a more appropriate cross-sectional shape.

Figure 25:
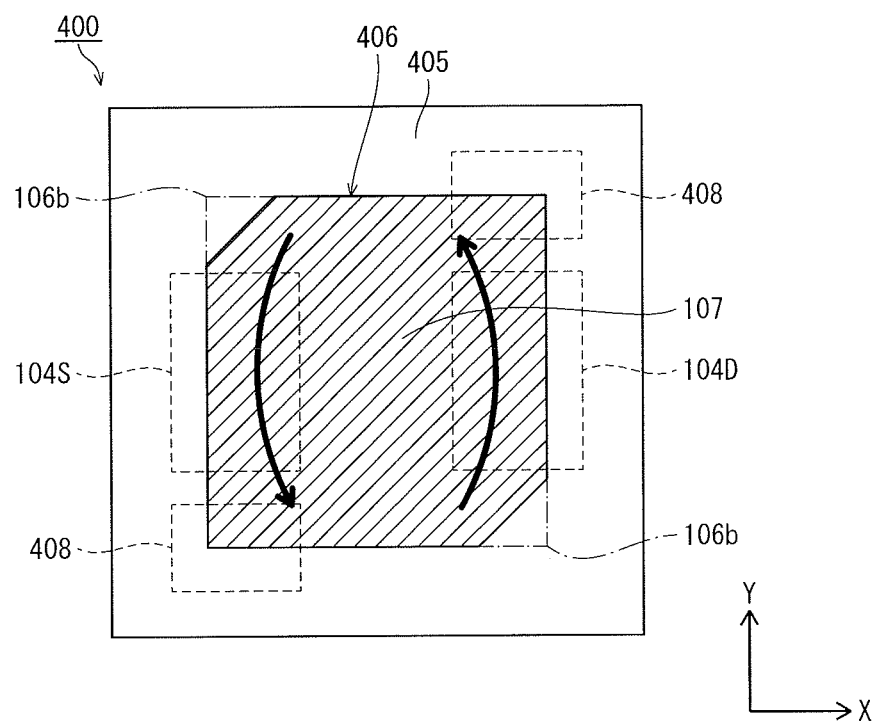
FIG. 25 is a schematic top view illustrating a configuration of a TFT 400 pertaining to Embodiment 5.

FIG. 25 is a schematic top view illustrating a configuration of a TFT 400 pertaining to Embodiment 5. The TFT 400 includes a base, a gate electrode, a gate insulation layer, a source electrode 104S, a drain electrode 104D, a bank 405 a semiconductor layer 107 and liquid-philic layers 408. Note that the base, the gate electrode and the gate insulation layer are not shown in FIG. 25.

The present embodiment is characterized by the shape, in plan view, of the aperture 406 defined by the bank 405. In FIG. 25, the outline of the aperture 106 pertaining to Embodiment 1 is depicted as a dashed-dotted line. Compared with the aperture 106, the aperture 406 pertaining to the present embodiment has a shape of square with two of the corners 106b cut away.

Due to such a shape of the aperture 406, the semiconductor ink applied within the aperture 406 flows along the directions indicated by the arrows in FIG. 25. As a result, the semiconductor ink flows in a fixed direction during the drying of the semiconductor ink, which results in reduction of variations in the thickness of the semiconductor layer 107. Thus, together with the advantageous effects of the liquid-philic layers 408, the stated configuration further improves the cross-sectional shape of the semiconductor layer 107.

Note that although the example shown in FIG. 25 has only two liquid-philic layers 408, the TFT may have four liquid-philic layers 408, in the same manner as the liquid-philic layers 108 pertaining to Embodiment 1.

Embodiment 6

Figure 26:
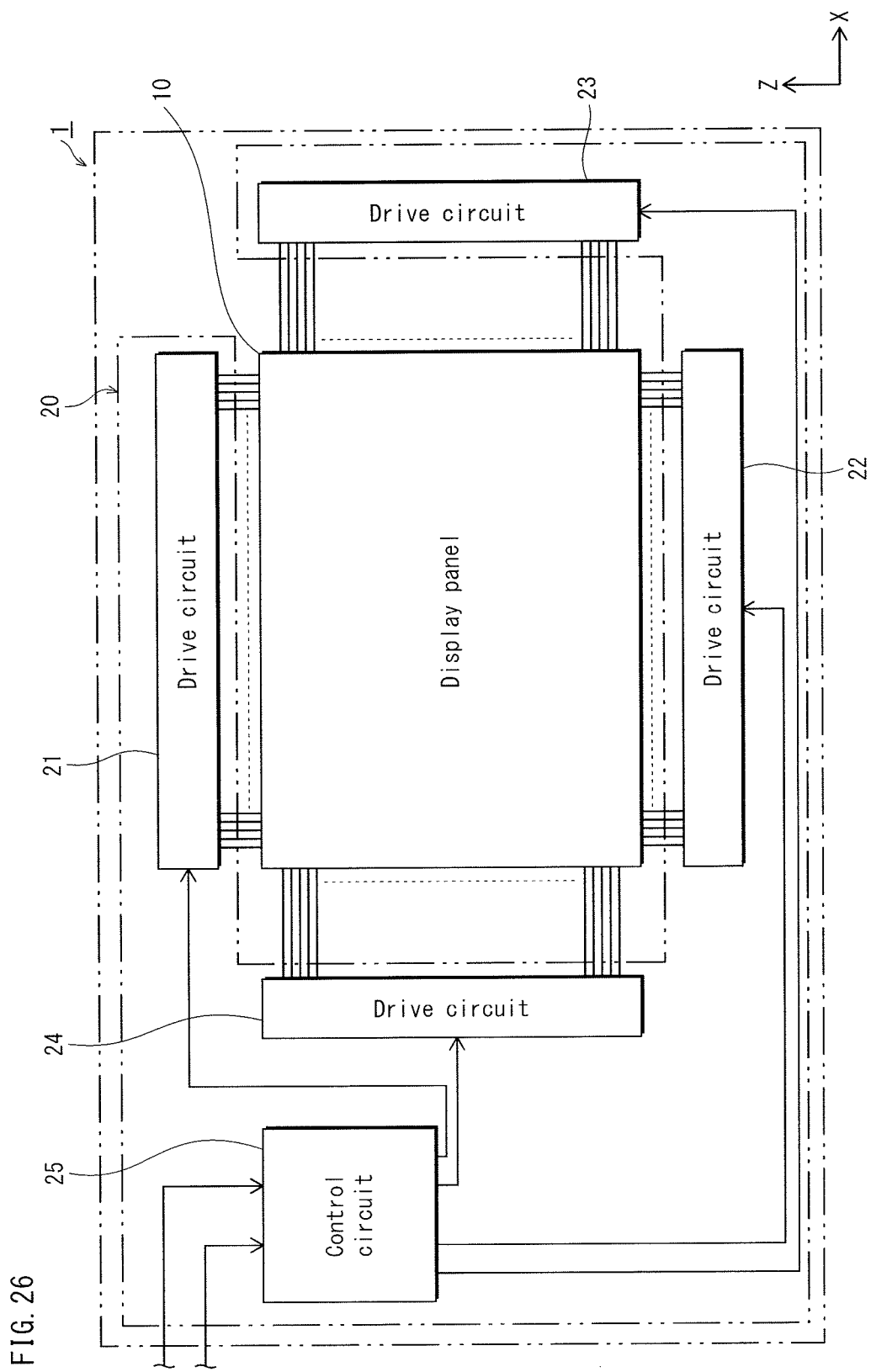
FIG. 26 is a diagram illustrating an overall configuration of an organic EL display device 1 pertaining to Embodiment 6.

The present embodiment describes an organic EL display device having a TFT pertaining to Embodiments 1, 2, 3 or 5. The following describes an organic EL display device having the TFT 100 (FIG. 1) pertaining to Embodiment 1 as an example.
[Overall Configuration of Organic EL Display Device 1]
FIG. 26 is a diagram illustrating an overall configuration of an organic EL display device 1 pertaining to Embodiment 6. As shown in FIG. 26, the organic EL display device 1 includes an organic EL display panel 10 and a drive control circuit unit 20 connected thereto.

The organic EL display panel 10 is a panel that uses the phenomenon of electroluminescence occurring in organic material and is composed of an array of a plurality of organic EL elements, arrange in a matrix for example. The drive control circuit unit 20 is composed of four drive circuits 21 through 24 and a control circuit 25.

Figure 27:
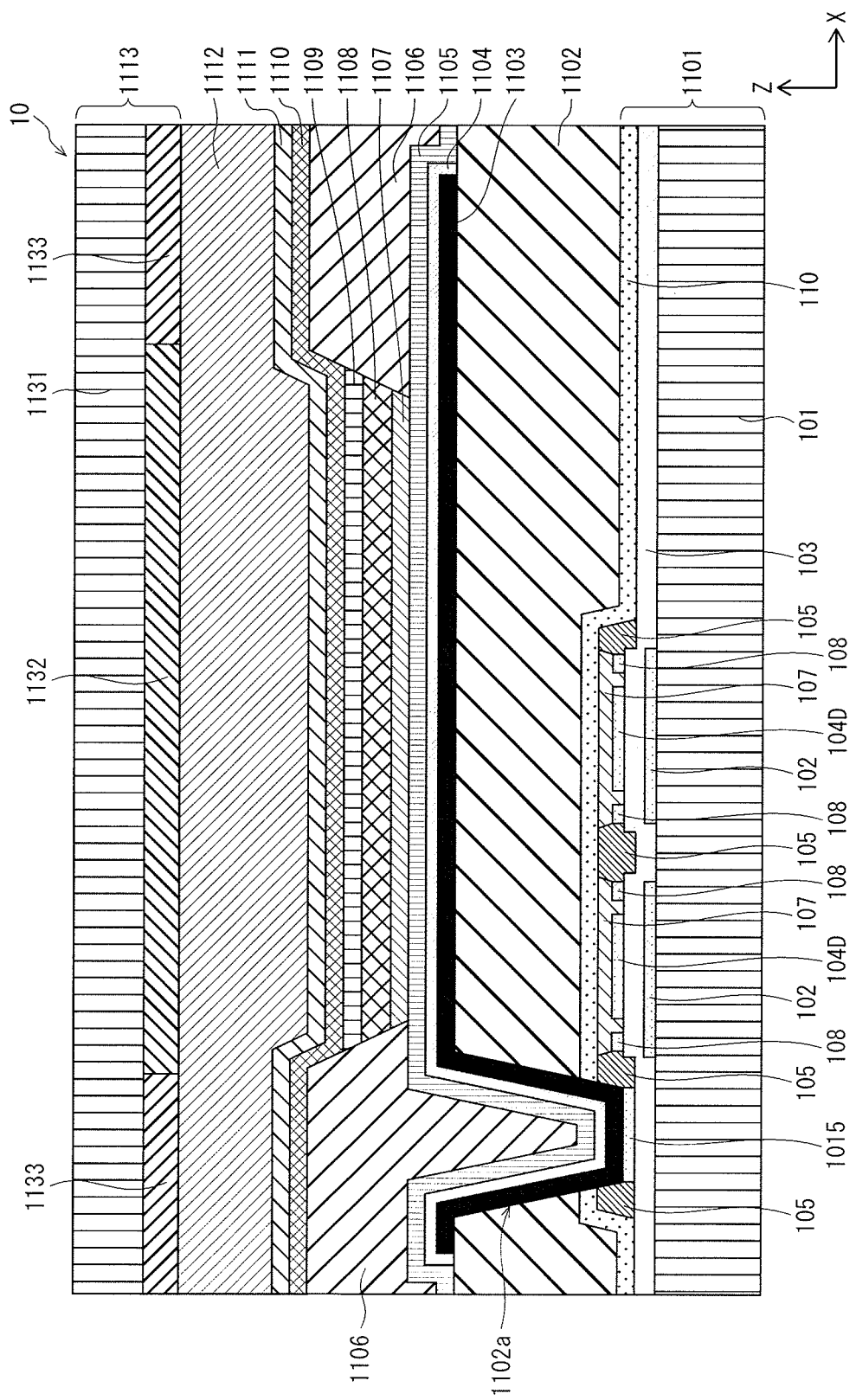
FIG. 27 is a schematic cross-sectional view illustrating a partial configuration of an organic EL display panel 10.

Note that the arrangement of the drive control circuit unit 20 in relation to the organic EL display panel 10 is not limited to the arrangement shown above.
[Configuration of Organic EL Display Panel 10]
FIG. 27 is a schematic cross-sectional view illustrating a partial configuration of the organic EL display panel 10.

As shown in FIG. 27, the organic EL display panel 10 includes various components formed on a TFT substrate 1101. The organic EL display panel 10 includes the TFT substrate 1101, a planarizing film 1102, a anode 1103, a light-transmissive electrically-conductive film 1104, a hole-injection layer 1105, a bank 1106, a hole transporting layer 1107, an organic light-emitting layer 1108, an electron transport layer 1109, a cathode 1110, a passivation layer 1111, an adhesive layer 1112 and a color filter (CF) substrate 1113.

The TFT substrate 1101 includes a base 101, gate electrodes 102, a gate insulation layer 103, source electrodes, drain electrodes 104D, a bank 105, semiconductor layers 107, liquid-philic layers 108, and connection wiring 1015. The TFT substrate 1101 is composed of a plurality of TFTs 100 each pertaining to Embodiment 1 (FIG. 1). The connection wiring 1015 is used for connecting the anode 1103 of the organic EL element formed above the TFT substrate 1101 and the TFTs serving as driving elements. Note that the source electrodes are not shown in FIG. 27 as they are hidden behind the drain electrodes 104D.

The upper surface of the TFT substrate 1101 is coated with the planarizing film 1102. However, a contact hole 1102a is provide above the connection wiring 1015.

On the main surface of the planarizing film 1102, the anode 1103, the light-transmissive electrically-conductive film 1104 and the hole injection layer 1105 are layered sequentially. The anode 1103, the light-transmissive electrically-conductive film 1104 and the hole-injection layer 1105 are also provided along the edge surface of the planarizing film 1102 that faces the contact hole 1102a. The anode 1103 is in contact with the connection wiring 1015 physically and electrically.

The bank 1106 is formed on the hole-injection layer 1105. In the aperture defined by the bank 1106, the hole transporting layer 1107, the organic light-emitting layer 1108, and the electron transport layer 1109 are layered sequentially.

Furthermore, the cathode 1110 and the passivation layer 1111 are sequentially layered so as to cover the electron transport layer 1109 and the exposed surface of the bank 1106. Furthermore, the CF substrate 1113 is arranged opposite the passivation layer 1111 with respect to the adhesive layer 1112 which is filled between the passivation layer 1111 and the CF substrate 1113. The CF substrate 1113 includes a substrate 1131 and a color filter 1132 and a black matrix 1133 which are formed on the lower main surface, in the Z-axis direction, of the substrate 1131.

[Modifications and Other Matters]

Although the present invention has been explained based on Embodiments 1 through 6, the present invention is not limited to these embodiments. For example, the following modifications may be considered.

(1) In Embodiment 5, a light-emitting element is explained as an example of electronic device that is not of three-terminal type. However, the present invention is not limited in this way. The present invention is broadly applicable to electronic devices having a semiconductor layer that is formed by applying semiconductor ink within an aperture and drying the ink. Examples of such electronic devices include photo sensors, solar cells, and so on.

(2) In the above-described embodiments, the liquid-philic layers are formed on four areas or on two areas. However, the number of the liquid-philic layers is not limited to any particular number. It suffices if at least one liquid-philic layer is formed. Also, a liquid-philic layer having an annular shape surrounding the central area of the upper surface of the substrate may be provided.

(3) In the above-described embodiments, the liquid-philic layers are formed from the same metal material as the source electrode and the drain electrode, in order to avoid increasing the number of manufacturing steps. However, the present invention is not limited to this example. The liquid-philic layers may be formed from an insulating material having a high degree of liquid-philicity. When the liquid-philic layers are formed from a metal material, it is necessary to form the liquid-philic layers to be separated from the source electrodes and the drain electrodes. When the liquid-philic layers are formed from an insulating material, however, it is not necessary to form the liquid-philic layers to be separated from the source electrodes or the drain electrodes. If this is the case, the liquid-philic layers may be formed continuously so as to be in contact with the source electrodes and the drain electrodes.

(4) In the above-described embodiments, the source electrodes, the drain electrodes and the liquid-philic layers are formed from the same material. However, the present invention is not limited in this way. Note, however, that it is possible to avoid increasing the number of manufacturing steps by forming the liquid-philic layers from the same material as at least the source electrodes or the drain electrodes.

(5) In the above-described embodiments, the source electrodes, the drain electrodes and the liquid-philic layers are formed so as to have a same film thickness in order to avoid increasing the number of manufacturing steps. However, in terms of the function of the liquid-philic layers, the film thickness of the liquid-philic layers is not limited to any particular value. When the film thickness of the liquid-philic layers 108 is no greater than the film thickness of the drain electrodes, such a configuration prevents the increase in the film thickness of the semiconductor layers near the inner edge of each aperture.

(6) All of the above-described embodiments are preferable examples of the present invention. Therefore, any numeric values, shapes, materials, constituent elements, locations of the constituent elements, connection configurations, manufacturing steps and the orders of the steps referred to in the description of the embodiments are merely examples, and they are not intended to limit the present invention. Therefore, among the constituent elements of the embodiments, those not recited in the independent claims are explained as elements for embodying the present invention in a preferable form. Also note that the drawings are schematic and hence not necessarily faithful. The components shown in each drawing are not drawn to scale. Also, the numerical ranges are intended to include the endpoints.

INDUSTRIAL APPLICABILITY

An electronic device pertaining to the present disclosure is applicable broadly to display devices such as television sets, personal computers, mobile telephones, tablets, smartphones and signage, and other various electronic devices.

REFERENCE SIGNS LIST

100, 100A thin-film transistor (TFT)
101 base
102 gate electrode
103 gate insulation layer
103a an area of the upper surface of the gate insulation layer 103
103b a central area of the upper surface of the gate insulation layer 103
103c a peripheral area of the upper surface of the gate insulation layer 103
104S source electrode
104D drain electrode
105 bank
106 aperture
106a a portion of a lateral surface of a bank surrounding an aperture
106b corner
107 semiconductor layer
108 liquid-philic layer
109 substrate

The invention claimed is:

1. An electronic device comprising:
    a substrate;
    a bank formed on an upper surface of the substrate, surrounding an area of the upper surface of the substrate, and defining an aperture from which the area of the upper surface is exposed;
    a liquid-philic layer formed on a peripheral portion of the area of the upper surface of the substrate, and not overlapping a central portion of the area of the upper surface of the substrate, the peripheral portion surrounding the central portion;
    a semiconductor layer formed within the aperture, and attaching to at least a portion of the central portion and to an upper surface of the liquid-philic layer; and
    a pair of electrodes that are in contact with an area of the semiconductor layer, the area of the semiconductor layer not overlapping the liquid-philic layer in plan view, wherein
    the bank has a liquid-phobic lateral surface surrounding the aperture, and
    the upper surface of the liquid-philic layer has a higher degree of liquid-philicity than the upper surface of the substrate.

2. The electronic device of claim 1, wherein
at least one of the pair of electrodes is formed on the upper surface of the substrate.

3. The electronic device of claim 2, wherein
said at least one of the pair of electrodes is separated from the liquid-philic layer, and
the liquid-philic layer includes a same material as said at least one of the pair of electrodes.

4. The electronic device of claim 2, wherein
the liquid-philic layer has a same film thickness as said at least one of the pair of electrodes.

5. The electronic device of claim 2, wherein
the liquid-philic layer has a smaller film thickness than said at least one of the pair of electrodes.

6. The electronic device of claim 1, wherein
the pair of electrodes is composed of a source electrode and a drain electrode, and is formed on the upper surface of the substrate or on an upper surface of the semiconductor layer, with an interval therebetween.

7. The electronic device of claim 6, wherein
the source electrode and the drain electrode are formed on the upper surface of the substrate.

8. The electronic device of claim 6, wherein
the substrate is a laminate including a base, a gate electrode formed on the base, and a gate insulation layer covering the gate electrode, and
the source electrode and the drain electrode are formed on an upper surface of the gate insulation layer.

9. The electronic device of claim 1, wherein
one of the pair of electrodes is formed on the central portion of the area of the upper surface of the substrate, and
the other one of the pair of electrodes is formed on a portion of an upper surface of the semiconductor layer, the portion of the upper surface of the semiconductor layer overlapping the central portion of the area of the upper surface of the substrate in plan view.

10. An electronic device manufacturing method comprising:
preparing a substrate;
forming a bank on an upper surface of the substrate, the bank surrounding an area of the upper surface of the substrate, defining an aperture from which the area of the upper surface is exposed, and having a liquid-phobic lateral surface surrounding the aperture;
forming a liquid-philic layer on a peripheral portion of the area of the upper surface of the substrate, the liquid-philic layer not overlapping a central portion of the area of the upper surface of the substrate, the peripheral portion surrounding the central portion, and the liquid-philic layer having a higher degree of liquid-philicity than the upper surface of the substrate;
forming a semiconductor layer attaching to at least a portion of the central portion and to an upper surface of the liquid-philic layer; and
forming a pair of electrodes that are in contact with an area of the semiconductor layer, the area not overlapping the liquid-philic layer in plan view.

11. The electronic device manufacturing method of claim 10, wherein
at least one of the pair of electrodes is formed on the upper surface of the substrate, and is separated from the liquid-philic layer, and
the liquid-philic layer is formed simultaneously with said at least one of the pair of electrodes.

* * * * *